(12) United States Patent
Jean et al.

(10) Patent No.: US 9,337,391 B2
(45) Date of Patent: May 10, 2016

(54) SEMICONDUCTOR LIGHT EMITTING DEVICE, LIGHT EMITTING DEVICE PACKAGE COMPRISING THE SAME, AND LIGHTING DEVICE COMPRISING THE SAME

(71) Applicant: SAMSUNG ELECTRONICS CO., LTD., Suwon-si, Gyeonggi-do (KR)

(72) Inventors: Jai Won Jean, Seoul (KR); Min Hwan Kim, Anyang-si (KR); Eun Deok Sim, Yongin-si (KR); Jong Hyun Lee, Suwon-si (KR); Heon Ho Lee, Seongnam-si (KR); Ho Chul Lee, Seongnam-si (KR); Jae Sung Hyun, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/661,950

(22) Filed: Mar. 18, 2015

(65) Prior Publication Data

US 2016/0043279 A1 Feb. 11, 2016

(30) Foreign Application Priority Data

Aug. 11, 2014 (KR) ................. 10-2014-0103943

(51) Int. Cl.
| | |
|---|---|
| *H01L 21/00* | (2006.01) |
| *H01L 33/32* | (2010.01) |
| *H01L 33/00* | (2010.01) |
| *H01L 33/02* | (2010.01) |
| *H01L 33/06* | (2010.01) |
| *H01L 33/14* | (2010.01) |
| *H01L 33/50* | (2010.01) |

(Continued)

(52) U.S. Cl.
CPC .......... *H01L 33/325* (2013.01); *H01L 33/0025* (2013.01); *H01L 33/025* (2013.01); *H01L 33/06* (2013.01); *H01L 33/14* (2013.01); *H01L 33/24* (2013.01); *H01L 33/46* (2013.01); *H01L 33/502* (2013.01); *B82Y 20/00* (2013.01); *Y10S 977/95* (2013.01)

(58) Field of Classification Search
CPC ............ H01L 33/325; H01L 336/0025; H01L 33/025
USPC ........................................................ 257/13
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |

(Continued)

FOREIGN PATENT DOCUMENTS

| | | |
|---|---|---|
| EP | 1145331 A | 10/2001 |
| JP | 2009-212523 A | 9/2009 |

(Continued)

*Primary Examiner* — Douglas Menz
(74) *Attorney, Agent, or Firm* — McDermott Will & Emery LLP

(57) ABSTRACT

A semiconductor light emitting device includes an n-type semiconductor layer, a border layer disposed on the n-type semiconductor layer, having band gap energy decreasing in a single direction, and represented by an empirical formula $Al_xIn_yGa_{1-x-y}N$ ($0 \le x \le 0.1$, $0.01 \le y \le 0.1$), an active layer disposed on the border layer and having a structure in which one or more InGaN layers and one or more GaN layers are alternately stacked, and a p-type semiconductor layer.

14 Claims, 13 Drawing Sheets

(51) Int. Cl.
*H01L 33/24* (2010.01)
*H01L 33/46* (2010.01)
*B82Y 20/00* (2011.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,822,991 B2 * | 11/2004 | Collins, III | H01L 27/15 257/96 |
| 6,847,057 B1 * | 1/2005 | Gardner | H01L 33/0004 257/99 |
| 6,849,881 B1 | 2/2005 | Harle et al. | |
| 6,858,081 B2 | 2/2005 | Biwa et al. | |
| 6,900,474 B2 * | 5/2005 | Misra | H01L 33/10 257/98 |
| 6,940,100 B2 | 9/2005 | Tsujimura et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 * | 3/2012 | Kang | H01L 33/0075 257/17 |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,440,996 B2 * | 5/2013 | Kang | H01L 33/0075 257/13 |
| 8,459,832 B2 | 6/2013 | Kim | |
| 8,502,242 B2 | 8/2013 | Kim | |
| 8,536,604 B2 | 9/2013 | Kwak et al. | |
| 8,686,397 B2 | 4/2014 | Nakamura et al. | |
| 8,735,931 B2 | 5/2014 | Han et al. | |
| 8,766,295 B2 | 7/2014 | Kim | |
| 8,866,167 B2 * | 10/2014 | Kang | H01L 33/24 257/96 |
| 2008/0149917 A1 | 6/2008 | Park | |
| 2009/0152586 A1 | 6/2009 | Lee et al. | |
| 2009/0224226 A1 | 9/2009 | Huang et al. | |
| 2010/0133506 A1 | 6/2010 | Nakanishi et al. | |
| 2010/0207098 A1 | 8/2010 | Avramescu et al. | |
| 2011/0187294 A1 | 8/2011 | Bergmann et al. | |
| 2012/0119187 A1 * | 5/2012 | Kang | H01L 33/0075 257/13 |
| 2013/0026446 A1 | 1/2013 | Han et al. | |
| 2013/0069034 A1 | 3/2013 | Hirayama | |
| 2013/0230938 A1 * | 9/2013 | Kang | H01L 33/0075 438/47 |
| 2013/0334493 A1 | 12/2013 | Luo | |
| 2014/0191192 A1 * | 7/2014 | Han | H01L 33/04 257/13 |

FOREIGN PATENT DOCUMENTS

| | | |
|---|---|---|
| JP | 2010-539686 A | 12/2010 |
| KR | 10-0482511 B1 | 4/2005 |
| KR | 10-0935379 B1 | 1/2010 |
| KR | 10-2012-0118055 A | 10/2012 |
| KR | 10-2012-0129666 A | 11/2012 |
| KR | 10-2013-0012375 A | 2/2013 |
| KR | 10-1228983 B1 | 2/2013 |
| KR | 10-2013-0099574 A | 9/2013 |
| WO | 2008/153130 A1 | 12/2008 |
| WO | 2011/104969 A1 | 9/2011 |
| WO | 2013/129812 A1 | 9/2013 |

* cited by examiner

SEMICONDUCTOR LIGHT EMITTING DEVICE, LIGHT EMITTING DEVICE PACKAGE COMPRISING THE SAME, AND LIGHTING DEVICE COMPRISING THE SAME

CROSS-REFERENCE TO RELATED APPLICATION

This application claims priority under 35 U.S.C. §119 to Korean Patent Application No. 10-2014-0103943, filed on Aug. 11, 2014, with the Korean Intellectual Property Office, the disclosure of which is incorporated herein by reference.

BACKGROUND

The present disclosure relates to a semiconductor light emitting device, light emitting device package and lighting device.

Light emitting diodes (LEDs) are semiconductor light emitting devices capable of generating various colors of light through the recombination of electrons and holes at junctions between first and second conductivity-type semiconductor layers when a current is applied thereto. Compared to light emitting devices based on filaments, such semiconductor light emitting devices have favorable characteristics such as a relatively long lifespans, low power consumption, excellent initial operating characteristics, and the like. Hence, demand for semiconductor light emitting devices is continuously increasing. In particular, group III nitride semiconductor devices capable of emitting blue light within short-wavelength region of the visible spectrum have recently come to prominence.

In the case of such semiconductor light emitting devices, a device structure in which an active layer is disposed between first and second conductivity-type semiconductor layers is generally used. In a case in which deterioration in film quality of an active layer such as agglomeration of particles and the like may occur at the time of growth of the active layer, characteristics of light emitted from light emitting devices may be degraded.

SUMMARY

Some embodiments of the present disclosure may provide a semiconductor light emitting device having improved light characteristics and preventing an efficiency droop phenomenon by preventing deterioration in a film quality of an active layer.

According to an aspect of the present disclosure, a semiconductor light emitting device may include a first conductivity-type semiconductor layer including an n-type GaN contact layer, an n-type GaN layer disposed on the n-type GaN contact layer, doped with silicon (Si) acting as an n-type dopant in a concentration of $2\times10^{18}$ cm$^{-3}$ to $9\times10^{19}$ cm$^{-3}$, and having a thickness of 1 nm to 500 nm, and an n-type superlattice layer disposed on the n-type GaN layer and having a structure in which two or more $Al_xIn_yGa_zN$ ($0\leq x,y,z\leq 1$, $x+y+z>0$) having different compositions are repeatedly stacked; a border layer disposed on the first conductivity-type semiconductor layer and having band gap energy decreasing in a direction away from the first conductivity-type semiconductor layer; an active layer contacting the border layer and having a multiple quantum well structure in which five or more quantum well layers and four or more quantum barrier layers are alternately stacked; and a second conductivity-type semiconductor layer including a p-type $Al_xIn_yGa_zN$ layer ($0\leq x,y,z\leq 1$, $x+y+z>0$) disposed on the active layer and having a composition ratio of aluminum (Al) increased or decreased in a direction away from the active layer, and a p-type GaN layer disposed on the p-type $Al_xIn_yGa_zN$ layer ($0\leq x,y,z\leq 1$, $x+y+z>0$), doped with magnesium (Mg) acting as a p-type dopant in a concentration of $1\times10^{18}$ cm$^{-3}$ to $9\times10^{21}$ cm$^{-3}$, and having a thickness of 30 nm to 150 nm, the concentration of magnesium being increased or decreased in a thickness direction. At least one of the first conductivity-type semiconductor layer, the border layer, the active layer and the second conductivity-type semiconductor layer has a V-shaped distortion containing layer formed thereon.

The border layer may contain a dopant, the dopant may be at least one of elements contained in the quantum well layer, and a concentration of the dopant may be lower than that of the element contained in the quantum well layer.

The active layer may emit light within a UV region (200 to 440 nm) or light within a blue region (440 nm to 480 nm).

The first conductivity-type semiconductor layer or the second conductivity-type semiconductor layer may include one or both of a phosphor layer and a quantum dot disposed thereon, and the phosphor layer may include at least one selected from a group consisting of at least one oxynitride-based phosphor selected from a group consisting of $Y_3Al_5O_{12}$:Ce, $Tb_3Al_5O_{12}$:Ce and $Lu_3Al_5O_{12}$:Ce; one silicate-based phosphor of $(Ba,Sr)_2SiO_4$:Eu or $(Ba,Sr)_3SiO_5$:Ce; at least one nitride-based phosphor selected from a group consisting of β-SiAlON:Eu, $La_3Si_6N_{11}$:Ce, α-SiAlON:Eu, $CaAlSiN_3$:Eu, $Sr_2Si_5N_8$:Eu, $SrSiAl_4N_7$:Eu, $SrLiAl_3N_4$:Eu, and $Ln_{4-x}(Eu_zM_{1-z})_xS_{12-y}Al_yO_{3+x+y}N_{18-x-y}$ ($0.5\leq x\leq 3$, $0\leq z\leq 0.3$, $0<y\leq 4$), Ln being at least one selected from a group consisting of a IIIa element and a rare-earth element, and M being at least one selected from a group consisting of Ca, Ba, Sr and Mg; and at least one fluoride-based phosphor selected from a group consisting of $K_2SiF_6$:Mn$^{4+}$, $K_2TiF_6$:Mn$^{4+}$, $NaYF_4$:Mn$^{4+}$ and $NaGdF_4$:Mn$^{4+}$.

A value of excitation power-independent shift ($\Delta E_1$) of the active layer may be 5 meV or less.

The border layer may be represented by an empirical formula $Al_xIn_yGa_{1-x-y}N$ ($0\leq x\leq 0.1$, $0.01\leq y\leq 0.1$).

The first conductivity-type semiconductor layer may include a mesa-etched and exposed region, or the first conductivity-type semiconductor layer or the second conductivity-type semiconductor layer may include a via, and the semiconductor light emitting device may include an electrode disposed on the exposed region or an electrode connected to the first or second conductivity-type semiconductor layer through the via. A diameter of the via may be in a range of 5 μm to 50 μm, and the number of the vias may be 3 to 300.

The electrode may be at least one of a distributed Bragg reflector configured of a metallic oxide, graphene, silver (Ag), aluminum (Al), $TiO_2$ and $SiO_2$, or a distributed Bragg reflector configured of $SiO_2$ and $Ta_2O_5$.

The border layer may further include an n-type conductive impurity, and the n-type conducive impurity may be silicon, and a concentration of the silicon may be in a range of $10^{17}$/cm$^3$ to $10^{18}$/cm$^3$.

According to another aspect of the present disclosure, a light emitting device package may include the semiconductor light emitting device described above.

According to another aspect of the present disclosure, a lighting device may include the semiconductor light emitting device described above, and the lighting device may be a bulb-type lighting device.

The lighting device may emit light having a color temperature range of 2700K to 5000K.

The lighting device may have a color rendering index Ra of 85 to 99.

According to another aspect of the present disclosure, a lighting device may include the semiconductor light emitting device described above, and the lighting device may be a bar-type lighting device.

According to another aspect of the present disclosure, a semiconductor light emitting device may include an n-type semiconductor layer; a border layer disposed on the n-type semiconductor layer, having band gap energy decreasing in a single direction, and represented by an empirical formula $Al_xIn_yGa_{1-x-y}N$ ($0 \leq x \leq 0.1$, $0.01 \leq y \leq 0.1$); an active layer disposed on the border layer and having a structure in which one or more InGaN layers and one or more GaN layers are alternately stacked; and a p-type semiconductor layer.

According to another aspect of the present disclosure, a semiconductor light emitting device may include a first conductivity-type semiconductor layer; a second conductivity-type semiconductor layer; an active layer disposed between the first and second conductivity-type semiconductor layers and having a structure in which one or more quantum well layers and one or more quantum barrier layers are alternately stacked; and a border layer disposed between the first conductivity-type semiconductor layer and the active layer and including a dopant which is one of elements contained in the one or more quantum well layers. A concentration of the dopant may be less than that of the one of the elements contained in the one or more quantum well layers.

The dopant may be indium. Band gap energy of the border layer may decrease toward a direction away from the first conductivity-type semiconductor layer.

The band gap energy of the border layer may decrease in a stepwise manner toward the direction away from the first conductivity-type semiconductor layer.

A thickness of the border layer may be from 1 nm to 10 nm.

A concentration of silicon doped in the border layer may be less than a concentration of silicon doped in one layer contained in the first conductivity-type semiconductor layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
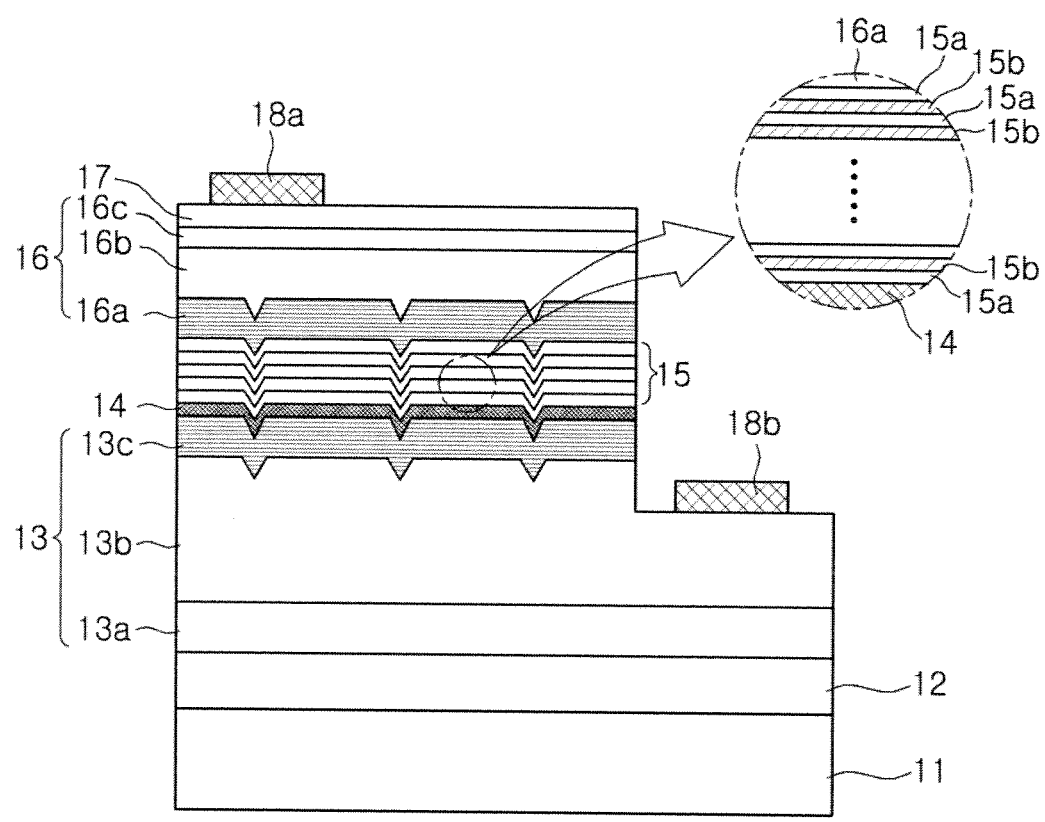
FIG. 1 is a cross-sectional view of a semiconductor light emitting device according to an exemplary embodiment of the present disclosure.

Embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. Unless explicitly described otherwise, the terms 'on', 'upper part', 'upper surface', 'lower part', 'lower surface', 'upward', 'downward', 'side surface', and the like will be used, based on the drawings, and may be changed depending on a direction in which a semiconductor device is disposed.

FIG. 1 is a cross-sectional view of a semiconductor light emitting device according to an exemplary embodiment of the present disclosure.

With reference to FIG. 1, a semiconductor light emitting device 10 may include a buffer layer 12, and a first conductivity-type semiconductor layer 13 including an n-type GaN contact layer 13a, an n-type GaN layer 13b doped with silicon (Si) acting as an n-type dopant in a concentration of $2 \times 10^{18}$ cm$^{-3}$ to $9 \times 10^{19}$ cm$^{-3}$ and having a thickness of 1 nm to 500 nm, and an n-type super-lattice layer 13c disposed on the n-type GaN layer 13b and having a structure in which two or more $Al_xIn_yGa_zN$ layers (here, $0 \leq x,y,z \leq 1$, $x+y+z>0$) having different compositions are repeatedly stacked, the buffer layer 12 and the first conductivity-type semiconductor layer 13 being sequentially formed on a substrate 11.

As the substrate 11, a substrate appropriate for the growth of a nitride semiconductor single crystal may be used, and the substrate 11 may be formed using a transparent material containing sapphire. Besides sapphire, zinc oxide (ZnO), gallium nitride (GaN), gallium arsenide (GaAs), silicon, silicon carbide (SiC), aluminium nitride (AlN), and the like may be used.

The buffer layer 12 may be a layer provided to improve lattice matching with the substrate 11 before the first conductivity-type semiconductor layer 13 is grown, may be generally formed using one or more of non-doped GaN, InGaN, AlN, InN, AlInGaN, SiC, and ZnO, and may also be omitted, according to a substrate type or substrate growth method, or the like.

The n-type GaN layer 13b and the n-type super-lattice layer 13c may be configured of a multilayer film in which an n-type impurity concentration, layer thicknesses, or layer components are changed. For example, a plurality of layers may be formed by changing a doping concentration of a GaN component, or an n-type multilayer may be formed by stacking two or more layers having different components such as GaN, InGaN, and AlGaN, repeatedly forming layers having different impurity concentrations, or repeatedly forming layers having different thicknesses.

A border layer 14 having band gap energy decreasing in a direction away from the first conductivity-type semiconductor layer 13, and an active layer 15 having a multiple quantum well structure in which five or more quantum well layers and four or more quantum barrier layers are alternately stacked, may be sequentially disposed on the first conductivity-type semiconductor layer 13.

Figure 2:
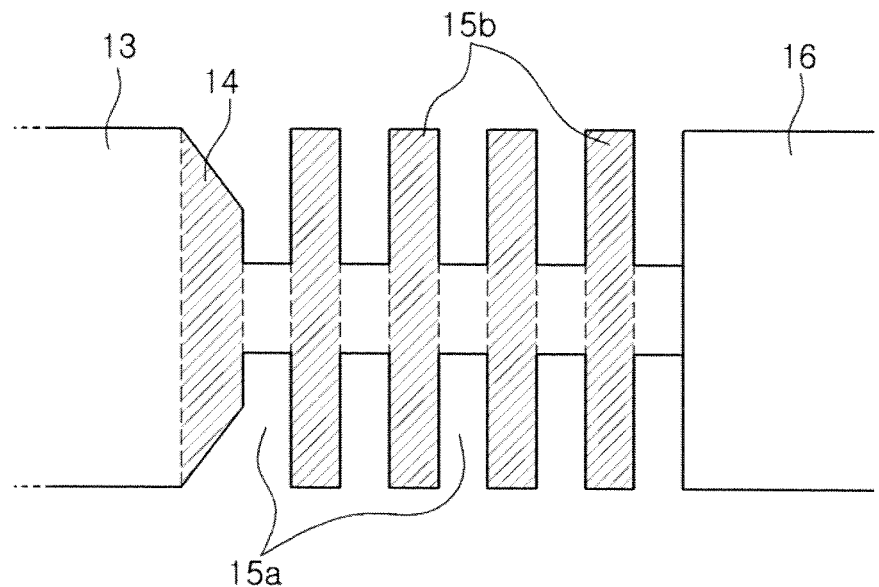
FIG. 2 is an energy band diagram illustrating energy bands in the vicinity of an active layer of a semiconductor light emitting device according to an exemplary embodiment of the present disclosure.

FIG. 2 is an energy band diagram illustrating energy bands in the vicinity of an active layer of a semiconductor light emitting device according to an exemplary embodiment of the present disclosure.

With reference to FIG. 2, there is illustrated an energy band diagram of the active layer 15 (FIG. 1) including five quantum well layers 15a and four quantum barrier layers 15b having degrees of band gap energy greater than that of the quantum well layer 15a, and a border layer 14 contacting the first conductivity-type semiconductor layer 13, the active layer 15 (FIG. 1) and the border layer 14 being disposed between the first conductivity-type semiconductor layer 13 and a second conductivity-type semiconductor layer 16. However, exemplary embodiments of the present disclosure are not limited to the number of the quantum well layers 15a and the quantum barrier layers 15b illustrated in the drawings, and the number of the quantum well layers 15a and the quantum barrier layers 15b may also be increased.

Band gap energy of the border layer 14 may be decreased in a direction away from the first conductivity-type semiconductor layer 13. Reductions in band gap energy may occur due to the addition of a dopant.

As a method of adding a dopant, a continuous method or a discontinuous method may be used.

In the case of the continuous dopant adding method, a dopant is continuously added during a dopant addition time. For example, an additional amount of dopant may be gradually increased or decreased in a direction away from the first conductivity-type semiconductor layer 13. Further, an additional amount of dopant may first be increased and then decreased, or may first be decreased and then increased.

In the case of the discontinuous dopant adding method, a dopant is intermittently added during a dopant addition time. For example, a dopant may only be added in a stepwise manner for a predetermined period of time in a direction away from the first conductivity-type semiconductor layer 13, and in this case, an addition amount of the dopant may be increased or decreased. In addition, the addition amount of the dopant may first be increased and then decreased, or may first be decreased and then increased.

A concentration gradient of a dopant or a band gap energy profile within the border layer 14 may not coincide with a profile of an addition amount of the dopant. The concentration gradient of a dopant or the band gap energy profile within the border layer 14, for example, may be smoothed without being angulated as illustrated in the band gap energy profile of FIG. 2. This phenomenon may be caused by diffusion of elements identical to the dopant due to heat generated during a growth procedure or concentration gradient, when the dopant is one of the elements contained in the quantum well layer 15a.

The dopant may be at least one of elements contained in the quantum well layer 15a. A concentration of the dopant added to the border layer 14 may be lower than that of an element contained in the quantum well layer 15a.

For example, the quantum well layer 15a and the quantum barrier layer 15b may be a group III nitride-based semiconductor layer, and in detail, the quantum well layer 15a may be an InGaN layer and the quantum barrier layer 15b may be a GaN layer. Here, the dopant added to the border layer 14 may be indium among elements contained in the quantum well layer 15a. A composition ratio of indium added to the border layer 14 may be lower than that of indium contained in the quantum well layer 15a. In this case, the band gap energy of the border layer 14 may be relatively increased as compared to band gap energy of the quantum well layer 15a.

The border layer 14 may have a composition represented by the following chemical formula 1.

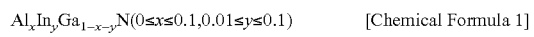

$Al_xIn_yGa_{1-x-y}N(0 \leq x \leq 0.1, 0.01 \leq y \leq 0.1)$ [Chemical Formula 1]

Here, in a case in which the composition ratio of indium is less than 0.01, an agglomeration phenomenon of indium may not be prevented, and in a case in which the composition ratio of indium exceeds 0.1, since band gap energy may be excessively reduced, light emission efficiency may be decreased due to a deterioration in electron confinement of the border layer 14.

A thickness of the border layer 14 may be 1 to 10 nm, preferably, 2 to 5 nm.

In addition, the border layer 14 may further include an n-type conductive impurity.

A height of the quantum barrier layer 15b may be decreased due to a voltage drop, and in order to prevent this phenomenon, an n-type conductive impurity having a relatively short diffusion length may be implanted in the quantum barrier layer 15b. By implanting the n-type conductive impurity, voltage drop of the quantum barrier layer 15b may be reduced, and electron confinement of a quantum well structure may be increased.

By the same principle, when the n-type conductive impurity is implanted in the border layer 14, the voltage drop of the border layer may be prevented so that a relatively large amount of electrons may be implanted, thereby further increasing light emission.

The n-type conductive impurity further contained in the border layer 14 may be silicon (Si).

In this case, a silicon concentration may be in a range of $10^{17}/cm^3$ to $10^{18}/cm^3$. In a case in which the silicon concentration is outside the range, electron implantation efficiency may be reduced, thus light emission may be deteriorated.

Figure 3:
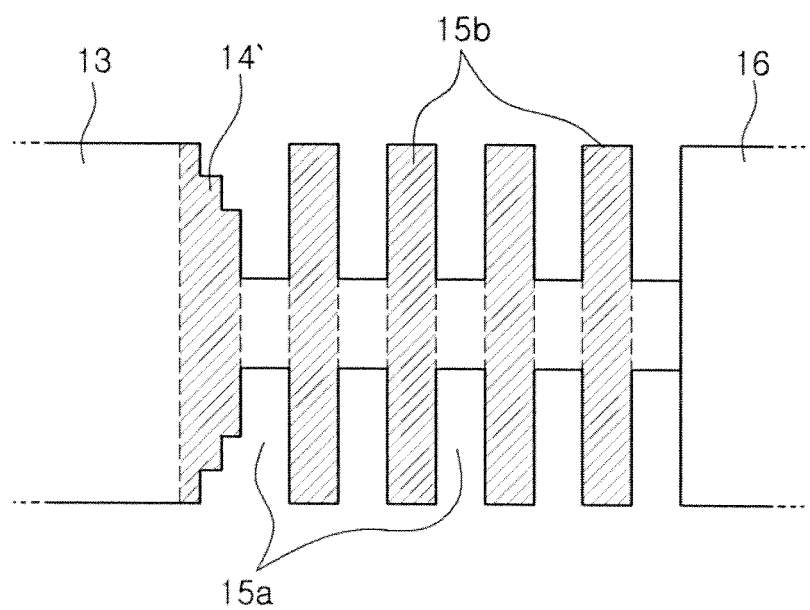
FIG. 3 is an energy band diagram illustrating energy bands in the vicinity of an active layer of a semiconductor light emitting device according to an exemplary embodiment of the present disclosure.

FIG. 3 is an energy band diagram illustrating energy bands in the vicinity of an active layer of a semiconductor light emitting device according to an exemplary embodiment of the present disclosure. A description overlapping that of FIG. 2 will be omitted.

With reference to FIG. 3, there is illustrated an energy band diagram of an active layer 15 (FIG. 1) including five quantum well layers 15a and four quantum barrier layers 15b having degrees of band gap energy greater than that of the quantum well layer 15a, and a border layer 14' contacting a first conductivity-type semiconductor layer 13, the active layer 15 (FIG. 1) and the border layer 14' being disposed between the first conductivity-type semiconductor layer 13 and a second conductivity-type semiconductor layer 16. However, exemplary embodiments of the present disclosure are not limited to the number of the quantum well layers 15a and the quantum barrier layers 15b illustrated in the drawings, and the number of the quantum well layers 15a and the quantum barrier layers 15b may also be increased.

Band gap energy of the border layer 14' may be decreased in a direction away from the first conductivity-type semiconductor layer 13. Reductions in band gap energy may occur due to addition of a dopant.

As a method of adding a dopant, a method of increasing a dopant amount in stepwise fashion in a direction away from the first conductivity-type semiconductor layer 13 may be used. The dopant may be any one of elements contained in the quantum well layer 15a. Here, a concentration of the dopant added to the border layer 14' may be lower than that of an element contained in the quantum well layer 15a.

The active layer may emit light within a UV region (200 to 440 nm) or light within a blue region (440 nm to 480 nm).

Referring again to FIG. 1, a p-type super-lattice layer 16a in which a composition ratio of aluminum (Al) is increased or decreased in a direction away from the active layer 15 and two or more layers having different compositions formed of $Al_xIn_yGa_zN$ ($0 \le x,y,z \le 1$, $x+y+z>0$) are repeatedly formed, and/or an electron blocking layer (not shown) formed of $Al_xIn_yGa_zN$ ($0 \le x,y,z \le 1$, $x+y+z>0$) in which a composition ratio of aluminum (Al) is increased or decreased in a direction away from the active layer 15, and a p-type GaN layer 16b and a p-type contact layer 16c in which magnesium (Mg), a p-type dopant, is doped in a concentration of $1 \times 10^{18}$ $cm^{-3}$ to $9 \times 10^{21}$ $cm^{-3}$ and the concentration of magnesium is increased or decreased in a thickness direction, each thickness of which ranging from 30 nm to 150 nm, may sequentially be disposed on the active layer 15. Here, the p-type GaN super-lattice layer and/or the p-type electron blocking layer, the p-type GaN layer 16b and the p-type contact layer 16c may constitute the second conductivity-type layer 16.

The active layer 15 may have a multiple quantum well structure including $Al_xIn_yGa_zN$ ($0 \le x,y,z \le 1$, $x+y+z>0$), for example, a structure in which an InGaN-based quantum well layer and a GaN-based quantum barrier layer, or a GaN-based quantum well layer and an AlGaN-based quantum barrier layer are alternately stacked. The p-type GaN layer 16b may also be configured of a multilayer film in which p-type impurity concentrations, layer thicknesses, or layer components are diverse. For example, a plurality of layers may be formed by changing a doping concentration of a GaN component, or a p-type multilayer may also be formed by stacking two or more layers having different components such as GaN, InGaN, and AlGaN, repeatedly forming layers having different impurity concentrations, or repeatedly forming layers having different thicknesses.

A V-shaped distortion containing layer may be formed in at least one of the first conductivity-type semiconductor layer 13, the border layer 14, the active layer 15, and the second conductivity-type semiconductor layer 16. The v-shaped distortion containing layer may include both of a growth plane (0001) parallel to a substrate surface and a growth plane inclined with respect to the substrate surface (a (1-101) plane, a (11-22) plane or other inclined crystal plane). Here, the growth plane parallel to the substrate surface indicates that on the basis of the substrate surface, an inclination of one crystal plane among the crystal planes grown thereon is inclined, for example, at an angle of 0 or more degrees or 90 degrees or less. A V-shaped defect may be formed around a threading dislocations penetrating through a light emitting structure to prevent a phenomenon in which a current is concentrated on the threading dislocations.

Inclinations of side angles of V-shaped valley portions of the V-shaped distortion containing layer may be reduced in a direction toward the active layer 15 and the second conductivity-type semiconductor layer 16 from the first conductivity-type semiconductor layer 13, for example, in a thickness direction of respective layers, and may be entirely flat at an interface with the p-type GaN layer 16b after being formed in the p-type super-lattice layer 16a or the p-type electron blocking layer, so as to be flat.

A transparent electrode layer 17 and/or a second electrode 18a may be disposed on the second conductivity-type semiconductor layer 16. In addition, a first electrode 18b may be disposed in a mesa-etched and exposed region of the first conductivity-type semiconductor layer 13. Although not illustrated in the drawings, the first conductivity-type semiconductor layer 13 may include a via, and an electrode connected to the first conductivity-type semiconductor layer 13 through the via may be disposed. In addition, although not illustrated in the drawings, the second conductivity-type semiconductor layer 16 may include a via, and an electrode connected to the second conductivity-type semiconductor layer 16 through the via may be disposed. Here, a radius of the via may be in a range of 5 μm to 50 μm, and the number of vias may be 3 to 300.

As a material of the transparent electrode layer 17, metal oxides such as ITO or ZnO, or a graphene-based material may be used. In the case of a semiconductor light emitting device having a flip-chip structure, a transparent electrode in the transparent electrode layer may be replaced by a reflective electrode, and as the reflective electrode, a metal such as silver (Ag) or aluminum (Al), a distributed Bragg reflector (DBR) in which a pair of $TiO_2$ and $SiO_2$ are stacked to be configured of a plurality of layers, or a distributed Bragg reflector in which a pair of $SiO_2$ and $Ta_2O_5$ are stacked to be configured of a plurality of layers, may be used.

In a case in which the nitride-based semiconductor layer is an InGaN layer, since decomposition temperatures of InN and GaN configuring InGaN have a relatively great difference therebetween, InGaN may be phase-separated into InN and GaN. In addition, in a case in which a GaN layer is grown at a high temperature of 1000° C. or higher, immediately on an InGaN layer formed at a low temperature of 800° C. or lower, indium within the InGaN layer may evaporate due to heat so that a composition of indium within the active layer may be non-uniform, for example, localization of indium may occur, and thus, a surface thereof may be coarse.

Therefore, for example, when the quantum well layer 15a is an InGaN layer and the quantum barrier layer 15b is a GaN layer, a film quality of such an active layer may be prevented from being deteriorated by adding indium to the border layer 14.

Since a degree of the localization of indium may be obtained by measuring a value of excitation power-independent shift $\Delta E_1$ obtained through a time-lapse peak shift test, the degree thereof may be indirectly confirmed. The method of measuring $\Delta E_1$ is described in experimental example 4.

$\Delta E_1$ may occur due to a carrier localization effect caused by potential fluctuation of indium. Thus, as a value of $\Delta E_1$ is reduced, the localization of indium may be relatively small.

When a relatively sufficient amount of indium is added to the border layer 14, an agglomeration phenomenon of indium in the active layer 15, that is, a localization phenomenon of indium may be reduced. In order to reduce the occurrence of localization of indium in the active layer 15, a value of the excitation power-independent shift $\Delta E_1$ may be 5 meV or less.

The following Table 1 illustrates the number of pairs of quantum well structures in Examples 1 to 3 of the present disclosure and Comparative Examples 1 to 3. Examples 1 to 3 are provided according to an exemplary embodiment of the present disclosure, in which indium is added to the border layer 14, while Comparative Examples 1 to 3 have the same quantum well structures as those of Examples 1 to 3, respectively, but indium is not added thereto.

TABLE 1

|  | Comparative Example 1 | Comparative Example 2 | Comparative Example 3 | Example 1 | Example 2 | Example 3 |
| --- | --- | --- | --- | --- | --- | --- |
| Number of Pairs | 5 | 6 | 7 | 5 | 6 | 7 |

Experimental Example 1

Figure 4:
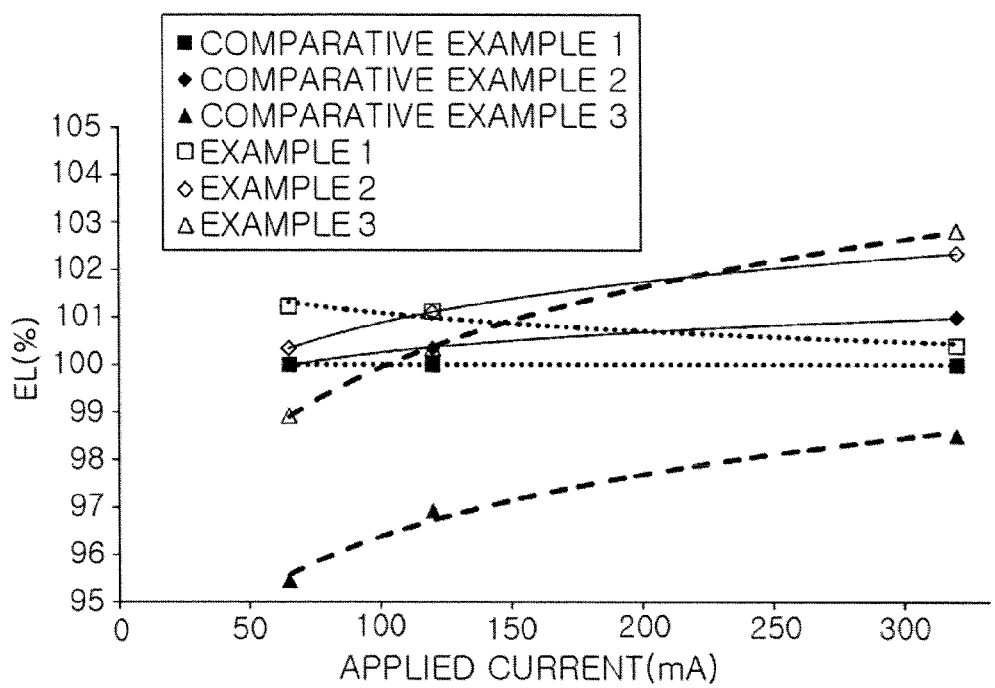
FIG. 4 is a graph illustrating a relative comparison of electroluminescence of Examples 1 to 3 of the present disclosure and electroluminescence of Comparative Examples 2 and 3, when electroluminescence of Comparative Example 1 is 100%.

FIG. 4 is a graph illustrating a relative comparison of electroluminescence of Examples 1 to 3 of the present disclosure and electroluminescence of Comparative Examples 2 and 3 when electroluminescence of Comparative Example 1 is 100%.

With reference to FIG. 4, in comparing the Comparative Examples and the Examples having the same pair number of quantum well structures, electrical light emission efficiency in the Examples of the present disclosure was further improved. A difference of the electrical light emission efficiency between a Comparative Example and an Example, the pair number of quantum well structures of the Comparative Example and the Example being the same, was in an increasing tendency as the number of pairs of quantum well structures was increased. Thus, as the pair number of the electrical light emitting device having a multiple quantum well structure is increased, light characteristics may be improved by adding indium to a border layer as in exemplary embodiments of the present disclosure.

Experimental Example 2

The following table 2 illustrates degrees of internal quantum efficiency (IQE) of Examples 1 and 2 and Comparative Examples 1 and 2, based on applied current.

TABLE 2

|  | Applied Current (mA) | | |
| --- | --- | --- | --- |
|  | 65 | 120 | 410 |
| IQE of Example 1 (%) | 89.9 | 86.2 | 71.9 |
| IQE of Example 2 (%) | 89.9 | 86.9 | 74.3 |
| IQE of Comparative Example 1 (%) | 90.0 | 86.6 | 72.3 |
| IQE of Comparative Example 2 (%) | 87.6 | 84.5 | 69.6 |

With reference to Table 2, there is no large difference in IQE between Example 1 and Comparative Example 1 in which the number of pairs of quantum well structures is 5, but in Example 2 and Comparative Example 2 in which the number of pairs of quantum well structures is 6, IQE of Example 2 is higher than that of Comparative Example 2. Therefore, when the number of pairs of quantum well structures is 6 or more, an IQE value may be increased by adding indium to a border layer as in exemplary embodiments of the present disclosure.

Experimental Example 3

The following table 3 represents comparison of an efficiency droop phenomenon in Examples 1 and 2 and Comparative Examples 1 and 2 according to an applied current.

TABLE 3

|  | Applied Current (mA) | | |
| --- | --- | --- | --- |
|  | 65 | 120 | 410 |
| Droop in Example 1 (%) | 3.9 | 7.9 | 23.1 |
| Droop in Example 2 (%) | 2.3 | 5.6 | 19.2 |
| Droop in Comparative Example 1 (%) | 2.1 | 5.7 | 21.3 |
| Droop in Comparative Example 2 (%) | 1.6 | 5.1 | 21.8 |

With reference to Table 3, when applied current is 65 or 120 mA, an efficiency droop phenomenon was not reduced in the Examples as compared to that in the Comparative Examples, but when applied current is 410 mA, although an efficiency droop phenomenon was not reduced in Example 1 as compared to that of Comparative Example 1, an efficiency droop phenomenon was reduced in Example 2 as compared to that of Comparative Example 2. Thus, when the number of pairs of quantum well structures is 6 or more and applied current is relatively high, an efficiency droop phenomenon may be reduced by adding indium as in an exemplary embodiment of the present disclosure.

Experimental Example 4

A time-resolved PL measurement test was carried out by using a semiconductor light emitting device having an active layer in which a quantum well layer was an InGaN layer and a quantum barrier layer was a GaN layer, and five quantum well layers and five quantum barrier layers (5 pairs), thickness of which being respectively 4.0 nm. The measurement test was performed using a streak camera interlocked with a 25 cm monochromator, using a grating of 300 grooves/mm. Pulsed excitation was provided by a frequency-doubled light beam of a mode-locked Ti:$Al_2O_3$ laser device pumped by a 5 W diode-pump solid-phase laser device and focused on a sample having a spot diameter of 200 µm. A pulse width was 150 fs having a repetition rate of 2 MHz. Laser excitation power was adjusted by a neutral density filter.

Each pulsed excitation was provided in a predetermined excitation power density. An amount of a change between a peak measured immediately after the provision thereof, for example, after 6 ns, and a peak measured after a sufficient time elapsed, for example, after 50 ns or more, was measured. This measured change may be defined as the time-lapsed peak shift $\Delta E$.

$\Delta E$ is comprised of an excitation power-dependent shift $\Delta E_p$ and an excitation power-independent shift $\Delta E_1$. A time-lapsed peak shift when excitation power is 1 mW or more is defined as $\Delta E_p$, and a time-lapsed peak shift when the excitation power is less than 1 mW is defined as $\Delta E_1$.

Figure 5:
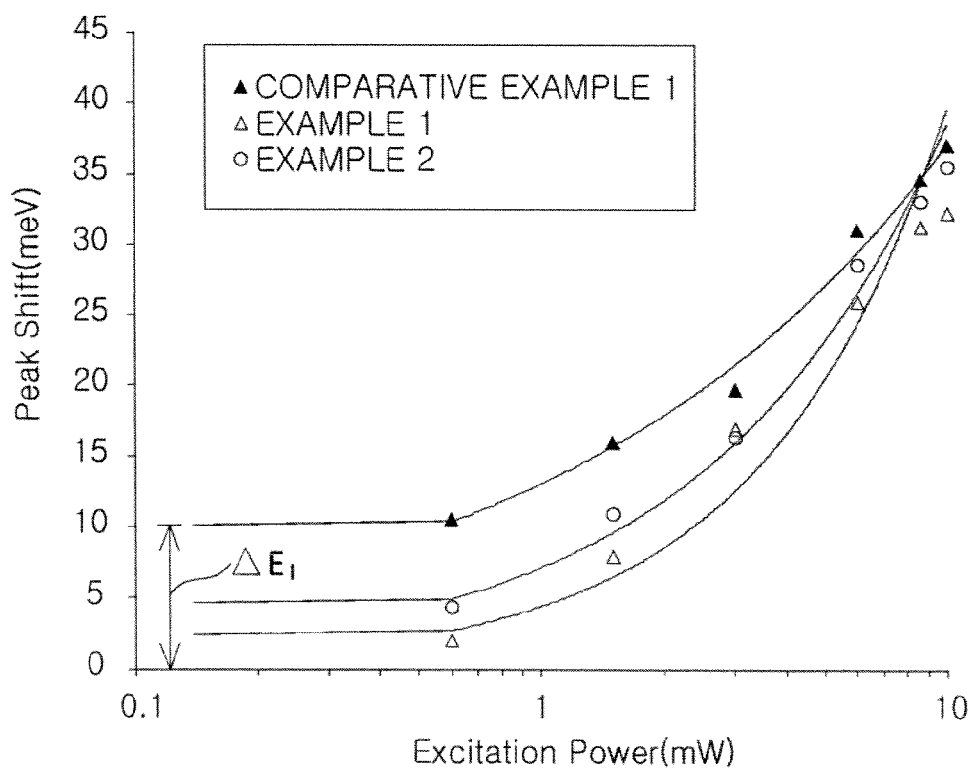
FIG. 5 is a graph respectively illustrating a change in time-lapsed peak shift values depending on a change in excitation power levels in Examples 1 and 2 and Comparative Example 1.

FIG. 5 is a graph respectively illustrating a change in time-lapsed peak shift values according to a change in excitation power levels in Examples 1 and 2 and Comparative Example 1.

With reference to the following table 4, $\Delta E_1$ values in Embodiments 1 and 2 and Comparative Example 1 are compared to each other.

TABLE 4

| | $\Delta E_1$ (meV) |
|---|---|
| Example 1 | 2.1 |
| Example 2 | 4.4 |
| Comparative Example 1 | 10.5 |

Referring to Table 4, $\Delta E_1$ values of Example 1 and 2 are lower than a $\Delta E_1$ value of Comparative example 1. Thus, by adding indium to a border layer as in an exemplary embodiment of the present disclosure, an agglomeration phenomenon of indium may be suppressed while preventing a film quality of the active layer from being deteriorated.

Experimental Example 5

Full widths at half maximum with respect to photoluminescence of Example 1 and Comparative Example 1 were 28 meV and 59 meV respectively. Thus, when indium was added to the border layer, as illustrated in the exemplary embodiment of the present disclosure, the full width at half maximum was decreased, so that light characteristics was improved.

Figure 6:
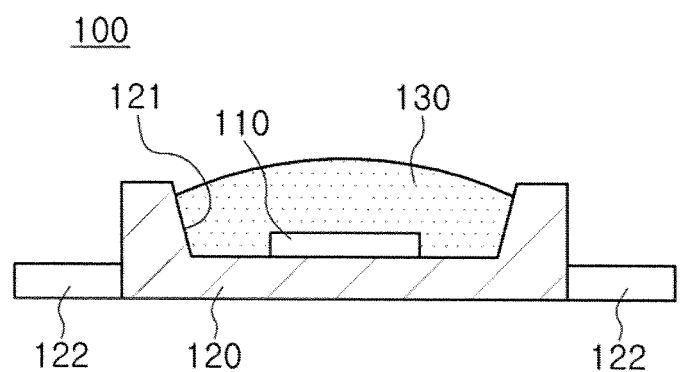
FIGS. 6 and 7 are cross-sectional views of light emitting device packages in which semiconductor light emitting devices according to exemplary embodiments of the present disclosure are employed.
Figure 7:
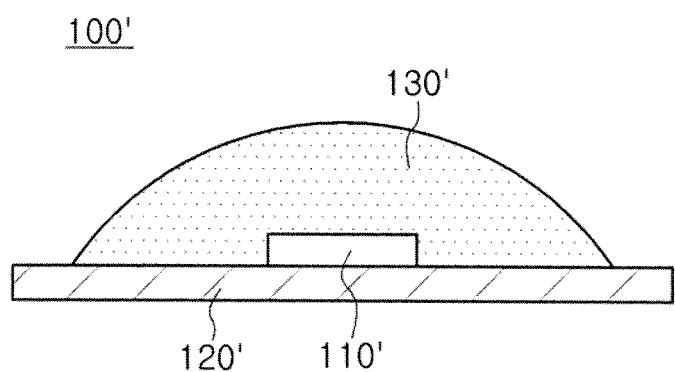

Hereinafter, a light emitting device employed in a light source module according to an exemplary embodiment of the present disclosure will be described. FIGS. 6 and 7 schematically illustrate light emitting devices that may be employed in light source modules according to exemplary embodiments of the present disclosure.

As illustrated in FIG. 6, a light emitting device 100 according to an exemplary embodiment of the present disclosure may have a package structure in which an LED chip 110 is mounted in a body 120 having a reflective cup 121 therein.

The body 120 may be provided as a base member in which the LED chip 110 is mounted to be supported thereto, and may be formed using a white molding compound having relatively high light reflectivity. Increase of an amount of light emission from the LED chip 110 to the outside through reflection may be obtained by this structure. Such a white molding compound may contain a thermosetting resin-based material having high heat resistance or a silicon resin-based material. In addition, a white pigment and a filler, a hardener, a release agent, an antioxidant, an adhesion promoter, and the like may be added to the thermosetting resin-based material. In addition, the body may also be formed using FR-4, CEM-3, an epoxy material, a ceramic material, or the like. In addition, the body may also be formed using a metal such as aluminum (Al).

The body 120 may include a lead frame 122 for an electrical connection to an external power source. The lead frame 122 may be formed using a material having excellent electrical conductivity, for example, a metal such as aluminum, copper, or the like. For example, when the body 120 is formed using a metal, an insulation material may be interposed between the body 120 and the lead frame 122.

In the case of the reflective cup 121 provided in the body 120, the lead frame 122 may be exposed to a bottom surface on which the LED chip 110 is mounted. The LED chip 110 may be electrically connected to the exposed lead frame 122.

The reflective cup 121 may have a structure in which an area of a transverse cross section of a surface thereof exposed to an upper part of the body 120 is greater than that of a bottom surface of the reflective cup 121. Here, the surface of the reflective cup 121 exposed to the upper part of the body 120 may be defined as a light emission surface of the light emitting device 100.

On the other hand, the LED chip 110 may be sealed by an encapsulant 130 formed in the reflective cup 121 of the body 120. The encapsulant 130 may contain a wavelength conversion material.

As the wavelength conversion material, for example, at least one or more phosphors excited by light generated in the LED chip 110 to thus emit light having a different wavelength may be used and contained in theencapsulant, so that light having various colors as well as white light may be adjusted to be emitted.

For example, when the LED chip 110 emits blue light, a light emitting device package including at least one of yellow, green, and red phosphors may emit white light having various color temperatures according to a phosphor mixing ratio. Alternatively, a light emitting device package in which a green or red phosphor is applied to the blue LED chip 110 may emit green or red light. By combining the light emitting device package emitting the white light and the light emitting device package emitting the green or red light, a color rendering index (CRI) and a color temperature of white light may be controlled. In addition, a light emitting device package may also be configured to include at least one light emitting device emitting violet light, blue light, green light, red light or infrared light. In this case, in the case of a light emitting device package 100 or a module product combined therewith, CRI may be controlled from sodium (Na) or the like, having a CRI of 40, to a solar level having a CRI of 100, and further, various types of white light having a color temperature of around 2000 K to 20000 K. In addition, color may be adjusted to be appropriate for an ambient atmosphere by generating violet, blue, green, red, orange visible ray light or infrared light. Further, light having a special wavelength, capable of promoting growth of plant, may also be generated.

Figure 8:
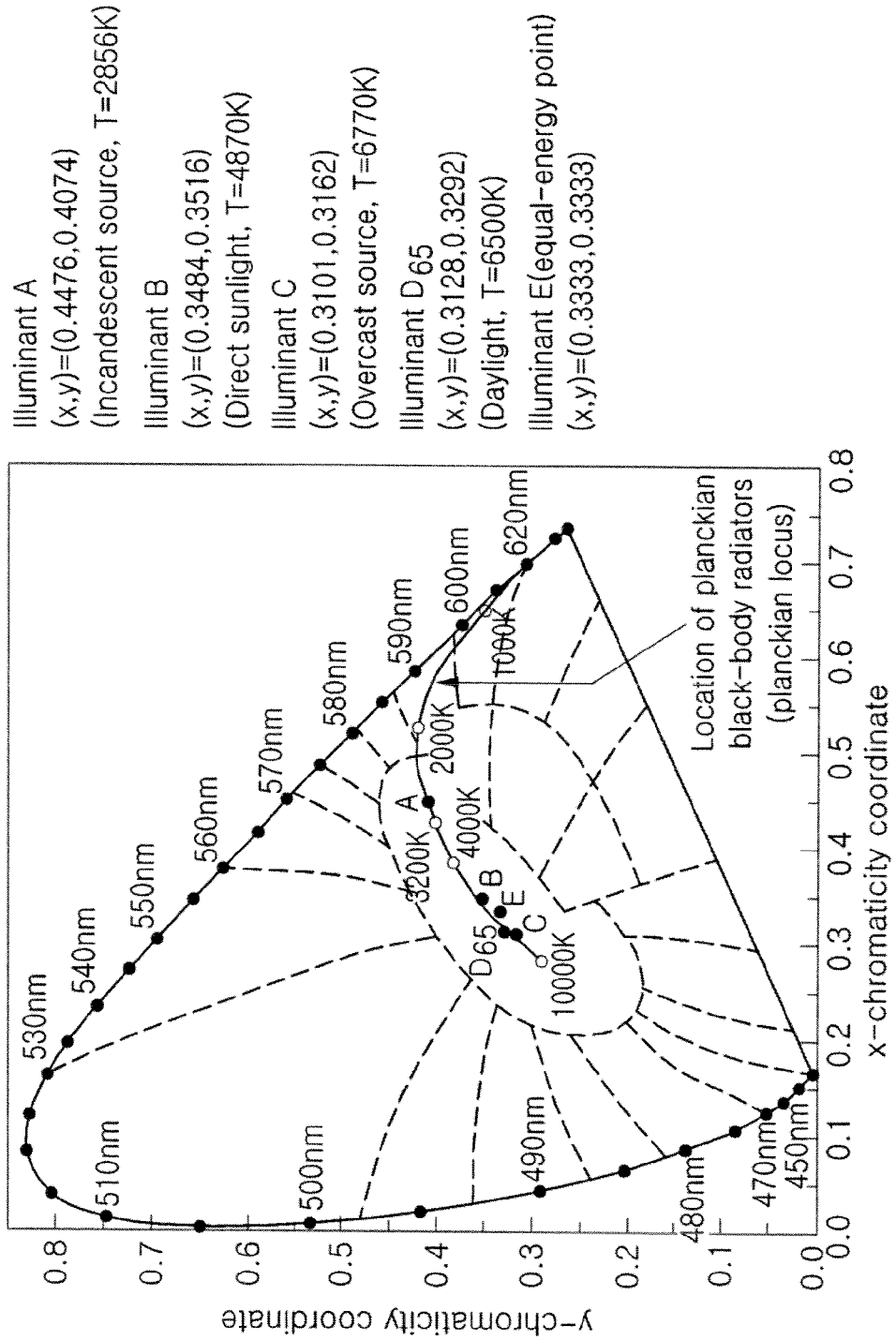
FIG. 8 illustrates a CIE 1931 chromaticity coordinate system.

FIG. 8 illustrates the CIE 1931 chromaticity coordinates system.

With reference to FIG. 8, white light provided by combining yellow, green, red phosphor and/or green, red LED with the UV or blue LED may have two or more peak wavelengths, and a coordinate (x, y) of the CIE 1931 chromaticity coordinate system illustrated in FIG. 8 may be located on a line segment (0.4476, 0.4074), (0.3484, 0.3516), (0.3101, 0.3162), (0.3128, 0.3292), and (0.3333, 0.3333). Alternatively, the coordinate (x, y) may be located in a region encompassed by the line segment and black body radiation spectrum. A color temperature of the white light may be in a range of 2000 K to 20000 K.

Figure 9:
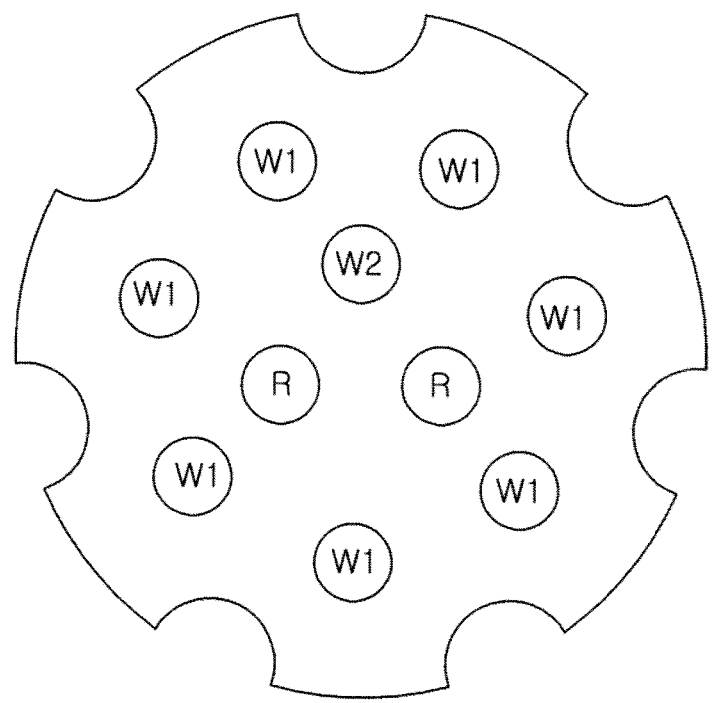
FIGS. 9 and 10 are plan views illustrating various examples of a light source module employed in a lighting device according to an exemplary embodiment of the present disclosure.

FIG. 9 illustrates a light source module that may be used in a lighting device according to an exemplary embodiment of the present disclosure;

With reference to FIG. 9, white light emitting device packages W1 having a color temperature of 4000 K, white light emitting device packages W2 having a color temperature of 3000 K, and red light emitting device packages R are disposed within a white light emitting device package module. A color temperature may be adjusted to be within a range of 2000 K to 4000 K by combining the light emitting device packages with one another, and a white light emitting device package module having a color rendering index Ra of 85 to 99 may be manufactured. The module may be used in a bulb type lamp illustrated in FIG. 14, or the like.

Figure 10:
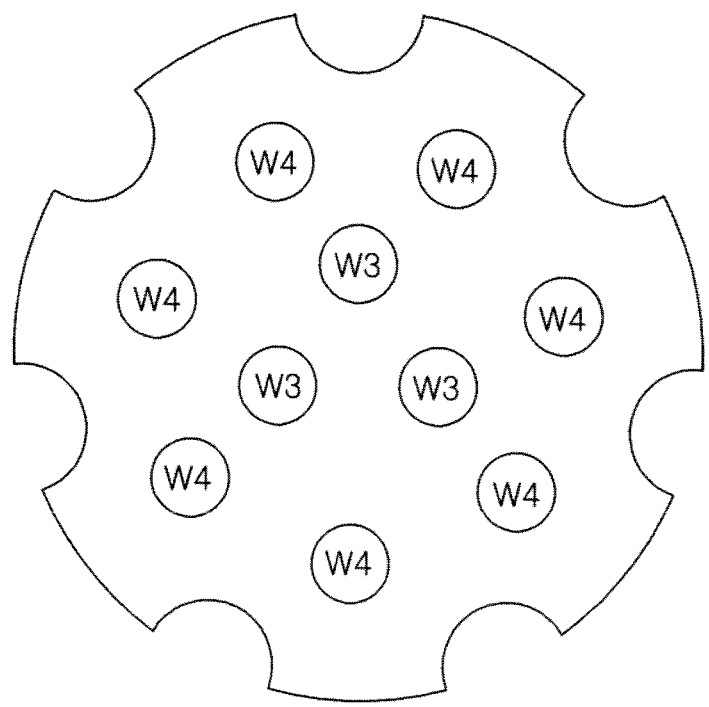

FIG. 10 illustrates a light source module that may be employed in a lighting device according to an exemplary embodiment of the present disclosure.

With reference to FIG. 10, white light emitting device packages W3 having a color temperature of 5000 K and white light emitting device packages W4 having a color temperature of 2700 K are disposed within a white light emitting device package module. A color temperature may be adjusted to be within a range of 2700 K to 5000 K by combining the light emitting device packages with one another, and a white light emitting device package module having a color rendering index Ra of 85 to 99 may be manufactured. The module may be used in a bulb type lamp illustrated in FIG. 14, or the like.

The number of light emitting device packages may be changed according to a basic color temperature set value. For example, when the basic color temperature set value approximates about 4000 K, the number of light emitting device packages having a color temperature of about 4000 K may be more than the number of light emitting device packages having a color temperature of 3000 K or the number of red light emitting device packages.

One or both of phosphor layer and quantum dot (QD) may be disposed on a first conductivity-type semiconductor layer or a second conductivity-type semiconductor layer.

Phosphors may be represented by the following empirical formulae and have a color as below.

Oxide-based Phosphor: Yellow and green $Y_3Al_5O_{12}$:Ce, $Tb_3Al_5O_{12}$:Ce, $Lu_3Al_5O_{12}$:Ce Silicate-based Phosphor: Yellow and green $(Ba, Sr)_2SiO_4$:Eu, Yellow and yellowish-orange $(Ba,Sr)_3SiO_5$:Ce Nitride-based Phosphor: Green β-SiAlON:Eu, Yellow $La_3Si_6N_{11}$:Ce, Yellowish-orange α-SiAlON:Eu, Red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \le x \le 3$, $0 \le z \le 0.3$, $0 < y \le 4$) (Here, Ln may be at least one element selected from a group consisting of group IIIa elements and rare-earth elements, and M may be at least one element selected from a group consisting of Ca, Ba, Sr and Mg)

Fluoride-based Phosphor: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$ A composition of phosphor should basically coincide with stoichiometry, and respective elements may be substituted with other elements in respective groups of the periodic table of elements. For example, Sr may be substituted with Ba, Ca, Mg, or the like, of an alkaline earth group II, and Y may be substituted with lanthanum-based Tb, Lu, Sc, Gd, or the like. In addition, Eu or the like, an activator, may be substituted with Ce, Tb, Pr, Er, Yb, or the like, according to a required energy level, and an activator alone or a co-activator or the like, for modification of characteristics thereof, may be additionally used.

In addition, as a phosphor substitute, materials such as a quantum dot or the like may be used, and a phosphor and a quantum dot alone, or a mixture thereof, may be used.

The quantum dot may be configured in a structure including a core (3 to 10 nm) formed using CdSe, InP, or the like, a shell (0.5 to 2 nm) formed using ZnS, ZnSe, or the like, and a ligand for stabilization of the core and the shell, and may implement various colors depending on the size thereof.

The following table 5 illustrates phosphor types of white light emitting devices using a UV LED chip (200 to 440 nm) or a blue LED chip (440 to 480 nm), for respective application fields.

TABLE 5

| Use | Phosphor |
|---|---|
| LED TV BLU | β-SiAlON: $Eu^{2+}$, (Ca, Sr)AlSiN$_3$:$Eu^{2+}$, La$_3$Si$_6$N$_{11}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$($0.5 \le x \le 3$, $0 < z < 0.3$, $0 < y \le 4$), K$_2$TiF$_6$:$Mn^{4+}$, NaYF$_4$:$Mn^{4+}$, |
| Illumination | Lu$_3$Al$_5$O$_{12}$:$Ce^{3+}$, Ca-α-SiAlON:$Eu^{2+}$, $La_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, |
| Side Viewing (Mobile Device, Laptop PC) | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, (Sr, Ba, Ca, Mg)$_2$SiO$_4$:$Eu^{2+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$($0.5 \le x \le 3$, $0 < z < 0.3$, $0 < y \le 4$), K$_2$TiF$_6$:$Mn^{4+}$, NaYF$_4$:$Mn^{4+}$, NaGdF$_4$:$Mn^{4+}$ |
| Headlights (Head Lamps, etc.) | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$: Eu, Ln$_{4-x}$(Eu$_z$M$_{1-z}$)$_x$Si$_{12-y}$Al$_y$O$_{3+x+y}$N$_{18-x-y}$($0.5 \le x \le 3$, $0 < z < 0.3$, $0 < y \le 4$), K$_2$TiF$_6$:$Mn^{4+}$, NaYF$_4$:$Mn^{4+}$, NaGdF$_4$:$Mn^{4+}$ |

Although the exemplary embodiment of the present disclosure illustrates the case in which the light emitting device 100 has a package structure in which the LED chip 110 is provided within the body 120 having the reflective cup 121, exemplary embodiments of the present disclosure are not limited thereto. For example, as illustrated in FIG. 7, a light emitting device 100' may have a chip-on-board (COB) structure in which an LED chip 110' is mounted on an upper surface of a body 120'. In this case, the body 120' may be a circuit board in which circuit wiring is formed, and an encapsulant 130' may have a lens structure protruding from an upper surface of the body 120' to cover the LED chip 110'.

In addition, the exemplary embodiment of the present disclosure illustrates the case in which the light emitting device 100 is a single package product, but is not limited thereto. For example, the light emitting device 100 may be the LED chip 110 itself.

Figure 11:
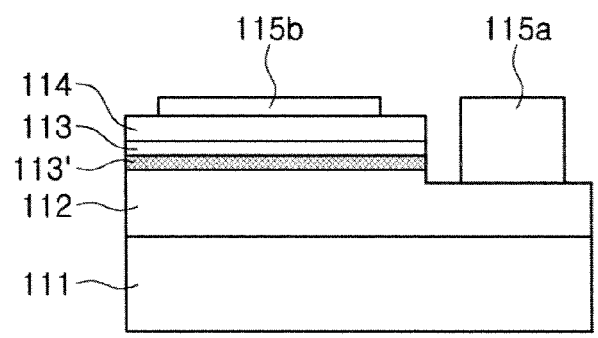
FIGS. 11 to 13 are cross-sectional views illustrating various examples of a light emitting diode chip that may be employed in a light source module according to an exemplary embodiment of the present disclosure.
Figure 12:
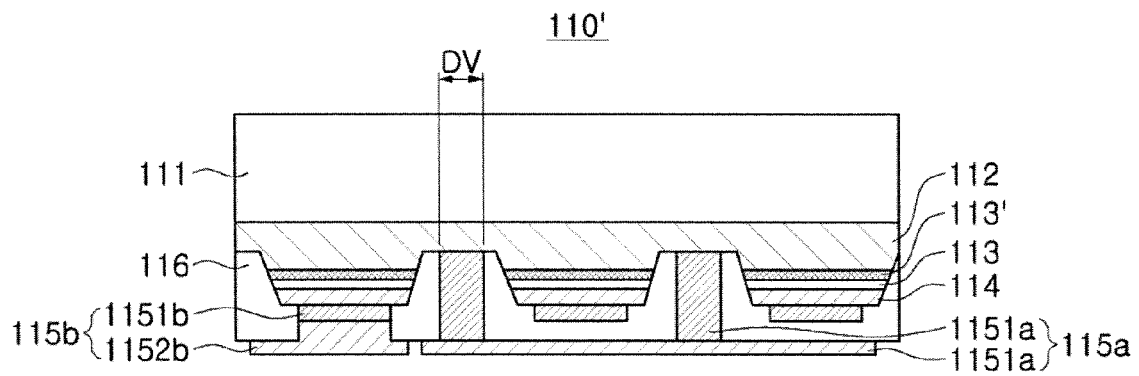
Figure 13:
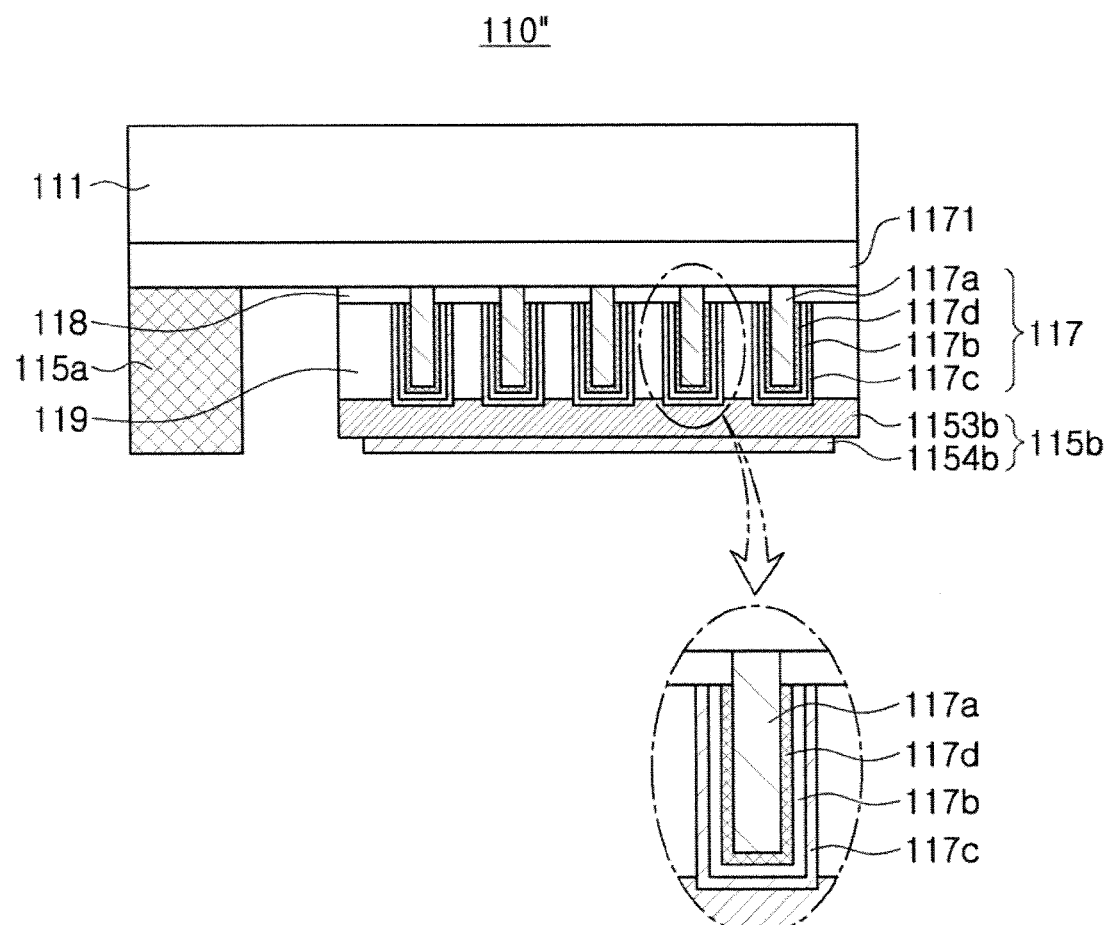

FIGS. 11 to 13 are cross-sectional views illustrating various examples of a light emitting diode chip that may be employed in a light source module according to an exemplary embodiment of the present disclosure.

With reference to FIG. 11, an LED chip 110 may include a first conductivity-type semiconductor layer 112, a border layer 113', an active layer 113 and a second conductivity-type semiconductor layer 114, sequentially stacked on a growth substrate 111.

The first conductivity-type semiconductor layer 112 stacked on the growth substrate 111 may be an n-type nitride semiconductor layer doped with an n-type impurity. The second conductivity-type semiconductor layer 114 may be a p-type nitride semiconductor layer doped with a p-type impurity. However, according to an exemplary embodiment of the present disclosure, locations of the first and second conductivity-type semiconductor layers 112 and 114 in a scheme in which they are stacked on each other may also be reversed.

The border layer 113' disposed on the first conductivity-type semiconductor layer 112 may be formed of the same material as the border layer 14 illustrated in FIG. 1.

The active layer 113 disposed between the border layer 113' and the second conductivity-type semiconductor layer 114 may emit light having a predetermined energy level through the recombination of electrons and holes. The active layer 113 may contain a material having an energy band gap smaller than those of the first and second conductivity-type semiconductor layers 112 and 114. The active layer 113 may have a multiple quantum well structure in which a quantum well layer and a quantum barrier layer are alternately stacked, but is not limited thereto. Thus, the active layer 113 may have a single quantum well structure, and further, a quantum dot, a nanowire, or a nanorod, may also be used therein.

The LED chip 110 may include first and second electrode pads 115a and 115b respectively and electrically connecting to the first and second conductivity-type semiconductor layers 112 and 114. The first and second electrode pads 115a and 115b may be exposed and disposed so as to be located in a single direction, and further, may be electrically connected to a substrate in a wire bonding scheme or a flip-chip bonding scheme.

With reference to FIG. 12, an LED chip 110' may include a first conductivity-type semiconductor layer 112, a border layer 113', an active layer 113, and a second conductivity-type semiconductor layer 114, sequentially stacked on a growth substrate 111.

The LED chip 110' may include first and second electrode pads 115a and 115b respectively connected to the first and second conductivity-type semiconductor layers 112 and 114. The first electrode pad 115a may include a conducive via 1151a penetrating the second conductivity-type semiconductor layer 114, the border layer 113', and the active layer 113 to be connected to the first conductivity-type semiconductor layer 112, and an electrode extension portion 1152a connected to the conductive via 1151a. The conductive via 1151a may be encompassed by an insulating layer 116 to be electrically isolated from the border layer 113', the active layer 113, and the second conductivity-type semiconductor layer 114. In the LED chip 110', the conductive via 1151a may be formed in a region thereof in which a semiconductor laminate has been etched. The number, a shape, or a pitch of the conductive vias 1151a, or a contact area thereof with the first conductivity-type semiconductor layer 112, and the like, may be appropriately designed, such that contact resistance is reduced. In addition, the conductive vias 1151a may be arranged so that rows and columns thereof may be formed on the semiconductor laminate, thereby improving current flow. The second electrode pad 115b may include an ohmic contact layer 1151b formed on the second conductivity-type semiconductor layer 114, and an electrode extension portion 1152b. The number of the conductive vias and a contact area thereof may be adjusted so that planar areas occupied by a plurality of conductive vias forming the rows and columns, in a region thereof contacting the first conductivity-type semiconductor layer, may be an area equal to 0.5% to 20% of the entire planar area of the light laminate. A diameter DV of the conductive via in a contact region thereof with the first conductivity-type semiconductor layer may be in a range of, for example, 5 $\mu$m to 50 $\mu$m, and the number of the conductive vias may be in a range of 3 to 300 for each light emitting laminate region, depending on an area of the light emitting laminate region. The number of conductive vias may be changed depending on an area of the light emitting laminate region, but may be, in further detail, four or more, and in addition, may have a matrix structure having rows and columns in a range in which a distance between the conductive vias is 100 $\mu$m to 500 $\mu$m, in detail, 150 $\mu$m to 450 $\mu$m. In a case in which a distance between the conducive vias is less than 100 $\mu$m, the number of conductive vias may need to be increased, a light emission area may be relatively reduced, and light emission efficiency may be decreased. In a case in which the distance between the conducive vias exceeds 500 $\mu$m, a current diffusion may be difficult and light emission efficiency may thus be deteriorated. A depth of the conductive via may be changed depending on a thickness of the second conductivity-type semiconductor layer and the active layer, and may be in a range of, for example, 0.5 $\mu$m to 5.0 $\mu$m.

An LED chip 110" illustrated in FIG. 13 may include a growth substrate 111, a first conductivity-type base layer 1171 formed on the growth substrate 111, and a plurality of nano-light emitting structures 117 formed on the first conductivity-type base layer 1171. The LED chip 110" may further include an insulating layer 118 and a filling part 119.

The nano light emitting structure 117 may include a first conductivity-type semiconductor core 117a; and a border layer 117d, an active layer 117b and a second conductivity-type semiconductor layer 117c which are formed as shell layers on a surface of the first conductivity-type semiconductor core 117a and sequentially formed thereon. The nano light emitting structure 117 may have various structures such as a pyramid structure, as well as a core-shell structure. The first conductivity-type semiconductor base layer 1171 may serve as a layer providing a growth surface of the nano light emitting structure. The insulating layer 118 may provide an open region for the growth of the nano light emitting structure 117, and may be formed using a dielectric material such as $SiO_2$ or $SiN_x$. The filling part 119 may structurally stabilize the nano light emitting structures 117 and may serve to allow light to penetrate or be reflected. In a manner different therefrom, in a case in which the filling part 119 contains a transparent material, the filling part 119 may be formed using a transparent material such as $SiO_2$, SiNx, an elastic resin, silicone, an epoxy resin, a polymer or a plastic material. As necessary, in a case in which the filling part 119 contains a reflective material, a ceramic powder or a metal powder having high reflectivity may be used in a polymer material such as polyphthalamide (PPA) or the like, in the filling part 119. As the high reflectivity ceramic material, at least one selected from a group consisting of $TiO_2$, $Al_2O_3$, $Nb_2O_5$, $Al_2O_3$ and ZnO may be used. In a manner different therefrom, high reflectivity metal may also be used, and a metal such as Al or Ag may be used.

The first and second electrode pads 115a and 115b may be disposed on lower surfaces of the nano light emitting structures 117. The first electrode pad 115a may be disposed on an exposed upper surface of the first conductivity-type semiconductor base layer 1171, and the second electrode pad 115b may include an ohmic contact layer 1153b formed on lower portions of the nano light emitting structures 117 and the filling part 119, and an electrode extension portion 1154b. In a manner different therefrom, the ohmic contact layer 1153b and the electrode extension portion 1154b may be integrally formed.

Figure 14:
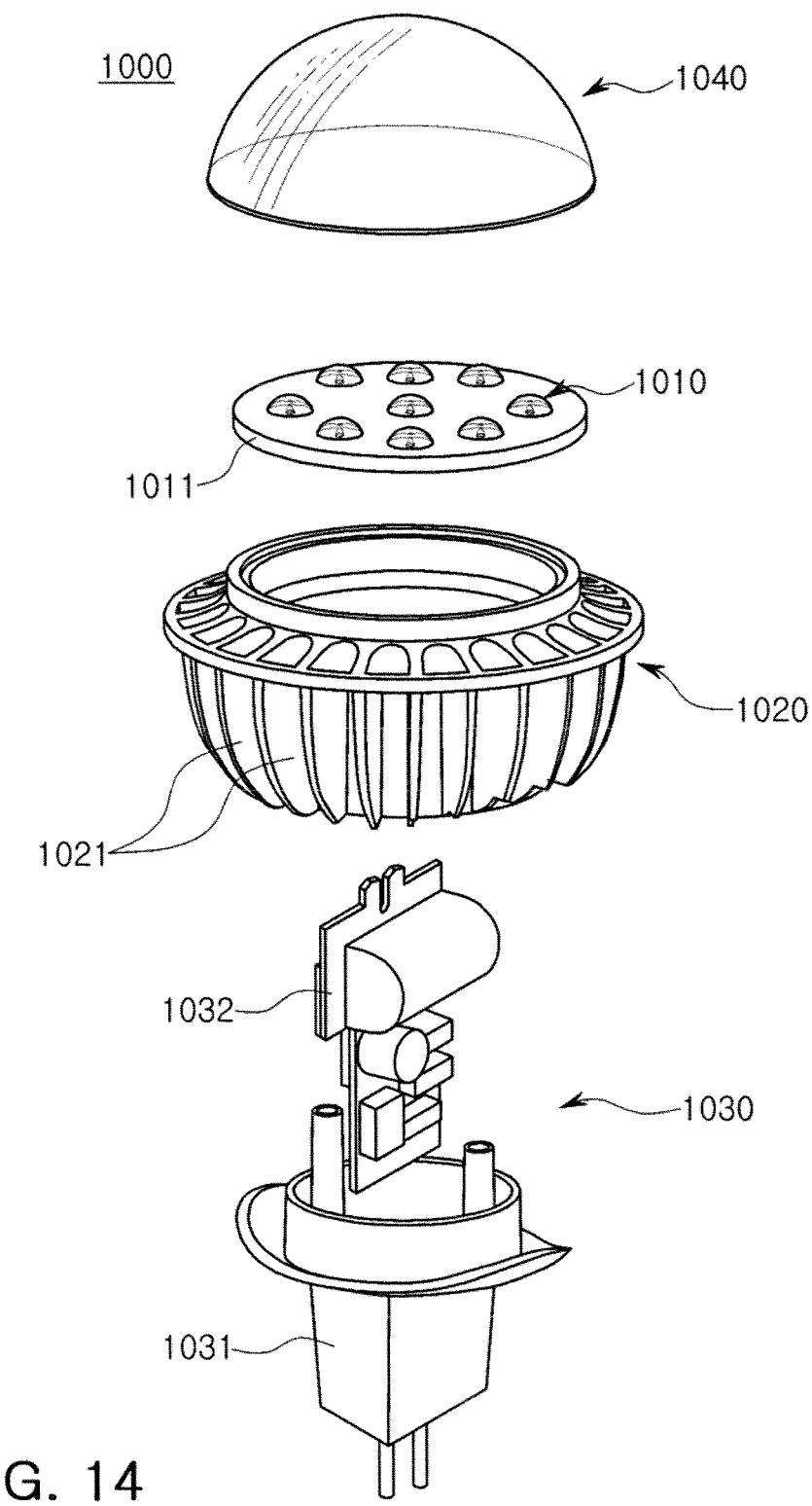
FIG. 14 is a schematic exploded perspective view of a bulb-type lighting device according to an exemplary embodiment of the present disclosure.

FIG. 14 schematically illustrates a lighting device according to an exemplary embodiment of the present disclosure.

With reference to FIG. 14, a lighting device 1000 according to an exemplary embodiment of the present disclosure may be a bulb-type lamp and may be used as an apparatus for indoor lighting, for example, a downlight. The lighting device 1000 may include a housing 1020 having an electrical connection structure 1030, and at least one light source module 1010 installed on the housing 1020. The lighting device 1000 may further include a cover 1040 covering the at least one light source module 1010.

The light source module 1010 may be substantially the same as the light source modules of FIGS. 6 and 7, and thus, a detailed description thereof will be omitted. In the case of the light source module 1010, a plurality of light source modules may be mounted on a circuit board 1011. The number of the light source modules 1010 may be variously controlled as needed.

The housing 1020 may serve as a frame supporting the light source module 1010 and a heat sink discharging heat generated in the light source module 1010 to the outside. To this end, the housing 1020 may be formed using a solid material having relatively high heat conductivity, for example, a metal such as aluminum (Al), a heat-radiation resin, or the like.

The housing 1020 may include a plurality of heat-radiating fins 1021 provided with an outer circumferential surface thereof, to allow for an increase in a contact area with surrounding air so as to improve heat radiation efficiency.

The housing 1020 may include the electrical connection structure 1030 electrically connected to the light source module 1010. The electrical connection structure 1030 may include a terminal portion 1031, and a driving portion 1032 supplying driving power supplied through the terminal portion 1031, to the light source module 1010.

The terminal portion 1031 may allow the lighting device 1000 to be installed on, for example, a socket or the like, so as to be fixed and electrically connected thereto. The exemplary embodiment of the present disclosure illustrates the case in which the terminal portion 1031 has a pin-type structure so as to be sliding inserted, but is not limited thereto. The terminal portion 1031 may have an Edison type structure having a screw thread so that it may be rotatably inserted, as needed.

The driving portion 1032 may serve to convert external driving power into an appropriate current source capable of driving the light source module. The driving portion 1032 may be configured of, for example, an AC to DC converter, a rectifying circuit component, a fuse, and the like. In addition, in some cases, the driving portion 1032 may further include a communications module capable of implementing a remote control function.

The cover 1040 may be installed on the housing 1020 to cover the at least one light source module 1010 and may have a convex lens shape or a bulb shape. The cover 1040 may be formed using a light transmitting material and may contain a light dispersion material.

Figure 15:
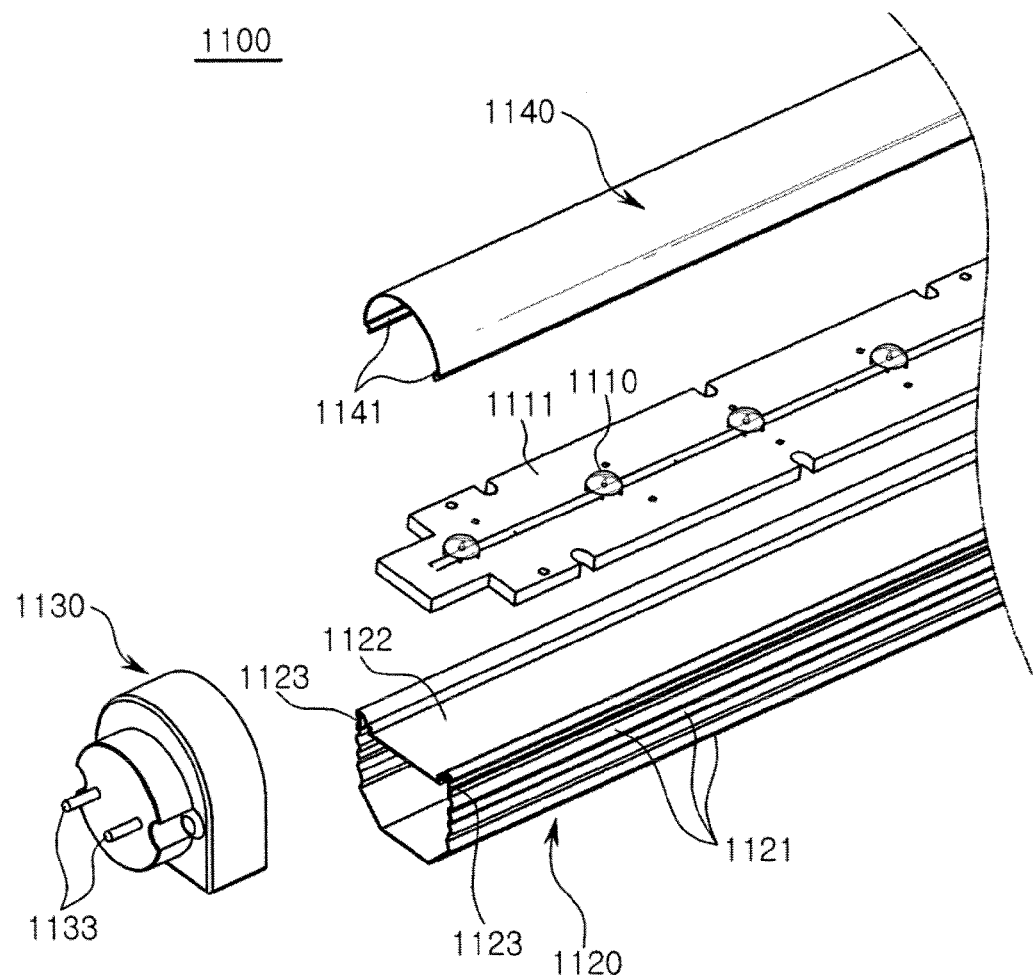
FIG. 15 is a schematic exploded perspective view of an L-lamp type lighting device according to an exemplary embodiment of the present disclosure.

FIG. 15 is a schematic exploded perspective view of a lighting device according to another exemplary embodiment of the present disclosure. With reference to FIG. 15, a lighting device 1100 may be a bar type lamp by way of example, and may include a light source module 1110, a housing 1120, a terminal portion 1130, and a cover 1140.

As the light source module 1110, the light source modules provided with reference to FIGS. 6 and 7 may be employed. Thus, a detailed description thereof will be omitted. In the case of the light source module 1110, a plurality of light source modules may be mounted on a circuit board 1111, and the mounting number thereof may be variously adjusted as necessary.

In the housing 1120, the light source modules 1110 may be mounted and fixed on one surface 1122 thereof, and the housing 1120 may allow heat generated by the light source modules 1110 to be discharged to the outside. To this end, the housing 1120 may be formed using a material having excellent heat conductivity, for example, a metal, and a plurality of heat radiation fins 1121 may be protruded from both side surfaces thereof.

The plurality of light source modules 1110 may be installed on the one surface 1122 of the housing 1120 in a state in which they are mounted and arrayed on the circuit board 1111.

The cover 1140 may be coupled to a stop groove 1123 of the housing 1120 so as to cover the light source modules 1110. In addition, the cover 1140 may have a hemispherical curved surface so as to allow for light generated by the light source modules 1110 to be uniformly irradiated to the outside. The cover 1140 may be provided with protrusions 1141 formed on lower portions of the cover in a length direction thereof so as to be engaged with the stop groove 1123 of the housing 1120.

The terminal portion 1130 may be provided at at least one open end of both distal ends of the housing 1120 in the length direction thereof so as to supply power to the light source modules 1110. The terminal portion 1130 may include electrode pins 1133 protruding externally.

Figure 16:
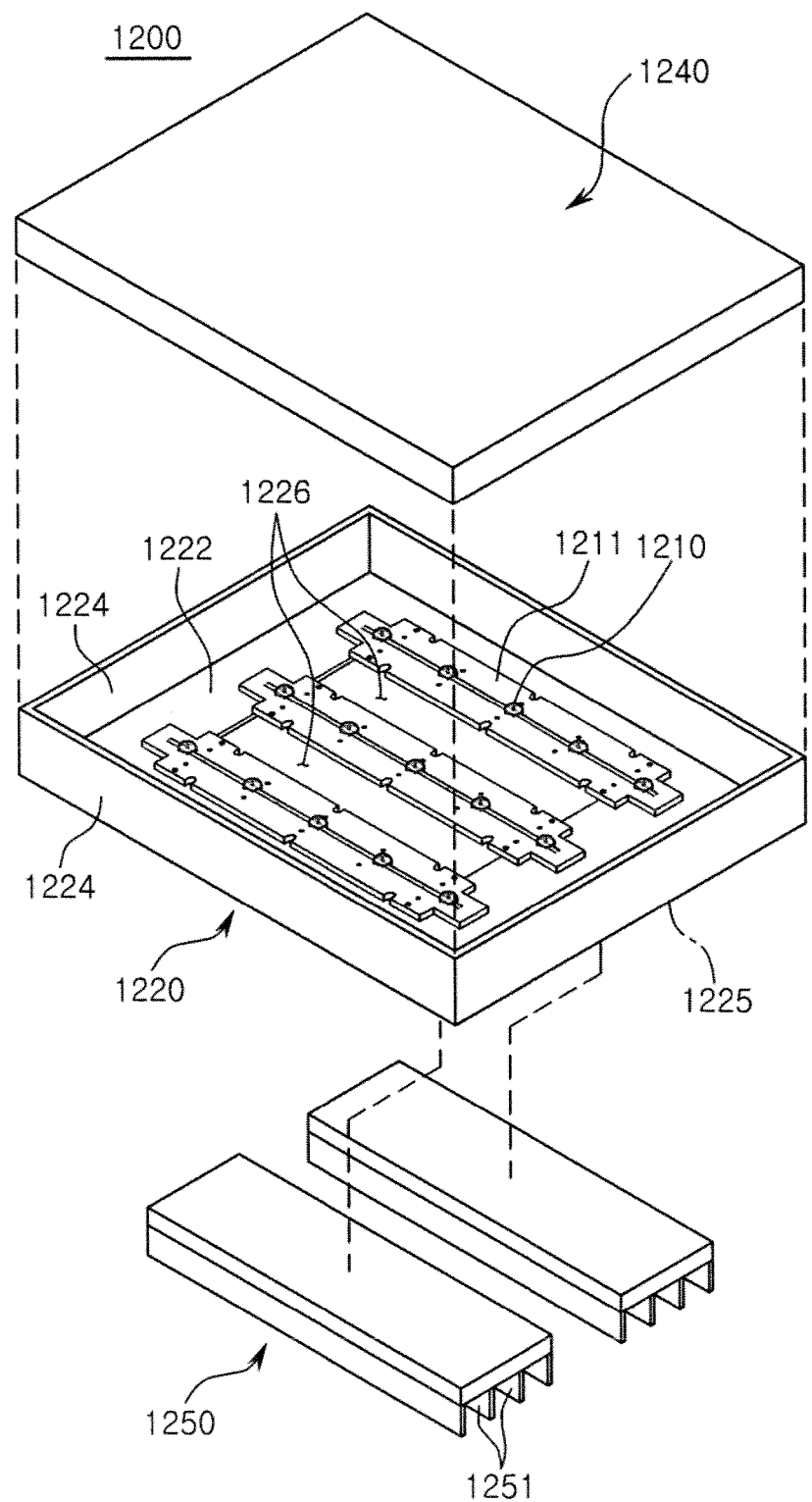
FIG. 16 is a schematic exploded perspective view of a flat-type lighting device according to an exemplary embodiment of the present disclosure.

FIG. 16 is a schematic exploded perspective view of a lighting device according to another exemplary embodiment of the present disclosure. With reference to FIG. 16, a lighting device 1200 may have a surface light source type structure by way of example, and may include a light source module 1210, a housing 1220, a cover 1240 and a heat sink 1250.

As the light source module 1210, the light source modules provided with reference to FIGS. 6 and 7 may be employed. Thus, a detailed description thereof will be omitted. As the light source module 1210, a plurality of light source modules may be used and may be mounted and arrayed on a circuit board 1211.

The housing 1220 may have a box-type structure formed by one surface 1222 thereof on which the light source modules 1210 are mounted and by sides 1224 thereof extended from edges of the one surface 1222. The housing 1220 may be formed using a material having excellent heat conductivity, for example, a metal, so as to allow heat generated by the light source modules 1210 to be discharged to the outside.

A hole 1226 through which the heat sinks 1250 described below are inserted and coupled thereto may be formed for the one surface 1222 of the housing 1220 to be penetrated through. In addition, the circuit board 1211 which is mounted on the one surface 1222 and on which the light source modules 1210 are mounted may be partially suspended across the hole 1226 to be exposed externally.

The cover 1240 may be coupled to the housing 1220 to cover the light source modules 1210. The cover 1240 may have a substantially flat structure.

The heat sink 1250 may be coupled to the hole 1226 through a different surface 1225 of the housing 1220. In addition, the heat sink 1250 may contact the light source modules 1210 through the hole 1226 to discharge heat of the light source modules 1210 to the outside. In order to improve heat radiation efficiency, the heat sink 1250 may include a plurality of radiation fins 1251. The heat sink 1250 may be formed using a material having excellent heat conductivity like a material of the housing 1220.

A lighting device using a light emitting device may be largely classified as an indoor LED lighting device and an outdoor LED lighting device. The indoor LED lighting device may be mainly used in a bulb-type lamp, an LED-tube lamp, or a flat-type lighting device, as an existing lighting device retrofit, and the outdoor LED lighting device may be used in a streetlight, a safety lighting fixture, a light transmitting lamp, a landscape lamp, a traffic light, or the like.

In addition, a lighting device using LEDs may be utilized as internal and external light sources in vehicles. As the internal light source, the lighting device using LEDs may be used as interior lights for motor vehicles, reading lamps, various types of light source for an instrument panel, and the like, and as the external light sources used in vehicles, the lighting device using LEDs may be used in all types of light sources such as headlights, brake lights, turn signal lights, fog lights, running lights for vehicles, and the like.

Furthermore, as light sources used in robots or in various kinds of mechanical equipment, LED lighting devices may be applied. In detail, an LED lighting device using light within a special wavelength band may promote the growth of a plant, may stabilize people's moods, or may also be used therapeutically, as emotional lighting.

A lighting system employing the lighting device therein will be described with reference to FIGS. 17 to 19. A lighting system 2000 according to an exemplary embodiment of the present disclosure may provide a lighting device capable of automatically controlling a color temperature according to ambient environments, for example, temperature and humidity, and serving as emotional lighting so as to satisfy human emotion instead of serving as simple lighting.

Figure 17:
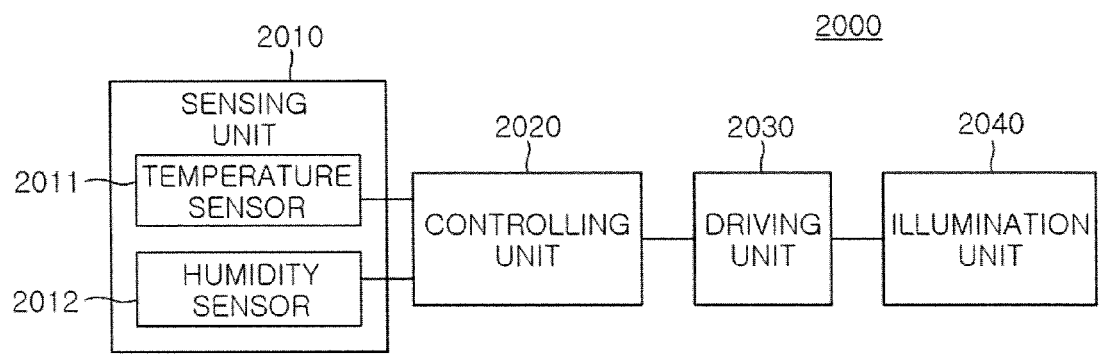
FIG. 17 is a schematic block diagram of a lighting system according to an exemplary embodiment of the present disclosure.

FIG. 17 is a schematic block diagram of a lighting system according to an exemplary embodiment of the present disclosure.

With reference to FIG. 17, the lighting system 2000 according to the exemplary embodiment of the present disclosure may include a sensing unit 2010, a controlling unit 2020, a driving unit 2030, and an illumination unit 2040.

The sensing unit 2010 may be installed indoors or outdoors, and may include a temperature sensor 2011 and a humidity sensor 2012 so as to measure at least one air condition in ambient temperatures and humidity. In addition, the sensing unit 2010 may transfer the measured air condition, for example, a temperature and humidity, to the controlling unit 2020 electrically connected thereto.

The controlling unit 2020 may compare the measured temperature and humidity with air conditions preset by a user, for example, temperature and humidity ranges, and may determine a color temperature of the illumination unit 2040 corresponding to the air condition, by the comparison result. The controlling unit 2020 may be electrically connected to the driving unit 2030 and may control the driving unit 2030 so as to drive the illumination unit 2040 using the determined color temperature.

Figure 18:
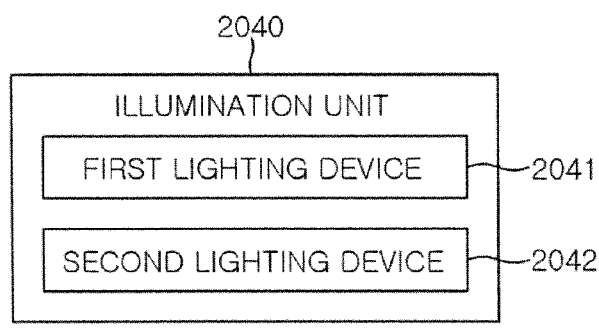
FIG. 18 is a schematic block diagram illustrating constituent elements of an illumination unit of a lighting device illustrated in FIG. 17.

FIG. 18 illustrates constituent elements of the illumination unit 2040 of FIG. 17.

With reference to FIG. 18, the illumination unit 2040 may operate according to power supplied by the driving unit 2030. The illumination unit 2040 may include at least one of the lighting devices illustrated in FIGS. 14 to 16. For example, the illumination unit 2040 may include a first lighting device 2041 and a second lighting device 2042 having different color temperatures, and each of the lighting devices 2041 and 2042 may include a plurality of light emitting elements emitting the same white light.

The first lighting device 2041 may emit white light of a first color temperature, and the second lighting device 2042 may emit white light of a second color temperature, and the first color temperature may be lower than the second color temperature. Alternatively, the first color temperature may be higher than the second color temperature. Here, white having a relatively low color temperature may correspond to warm white, and white having a relatively high color temperature may correspond to cold white. When power is supplied to such first and second lighting devices 2041 and 2042, white light respectively having the first color temperature and the second color temperature may be emitted, and respective white light may be mixed with each other to thus implement white light having a color temperature determined by the controlling unit.

In detail, in a case in which the first color temperature is lower than the second color temperature, when the color temperature determined by the controlling unit is relatively high, the mixed white light may be implemented to have the determined color temperature by reducing an amount of light of the first lighting device 2041 and increasing an amount of light of the second lighting device 2042. In an inverse case, for example, when the determined color temperature is relatively low, the mixed white light may be implemented to have the determined color temperature by increasing an amount of light of the first illumination device 2041 and reducing an amount of light of the second lighting device 2042. In this case, the amount of light of the respective lighting devices 2041 and 2042 may be adjusted by controlling a power for a light amount of all the light emitting devices to be adjusted, or by adjusting the number of driven light emitting elements.

Figure 19:
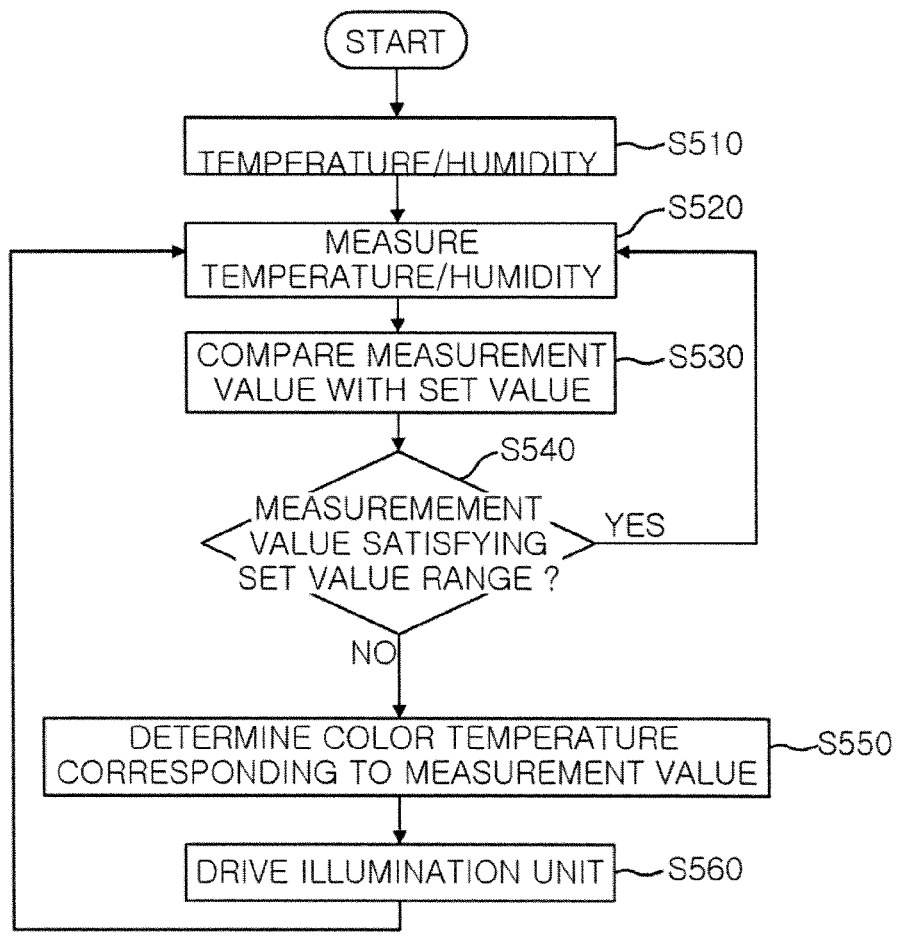
FIG. 19 is a flow chart illustrating a method of controlling the lighting system of FIG. 17.

FIG. 19 is a flow chart illustrating a method of controlling the lighting system of FIG. 17. With reference to FIG. 19, a color temperature depending on temperature and humidity ranges may be set through a controlling unit by a user in S510. The set temperature and humidity data may be stored in the controlling unit.

In general, in a case in which a color temperature is 6000 K or more, a cool color such as blue or the like may be exhibited, and in a case in which a color temperature is 4000 K or less, a warm color such as red or the like may be exhibited. Thus, in the exemplary embodiment of the present disclosure, a user may set the color temperature of the illumination unit above 6000 K or more when the temperature and humidity respectively exceed 20 degrees and 60% through the controlling unit; a user may set the color temperature of the illumination unit in a range of 4000~6000 K when the temperature and humidity are respectively in ranges of 10 degrees to 20 degrees and 40% to 60% through the controlling nit; a user may set the color temperature of the illumination unit below 4000 K when the temperature and humidity are respectively 10 degrees or lower and 40% or lower through the controlling unit.

Subsequently, the sensing unit may measure at least one condition among ambient temperature and humidity in S520. The temperature and humidity measured by the sensing unit may be transferred to the controlling unit.

Next, the controlling unit may compare a measured value transferred from the sensing unit with a set value in S530. Here, the measured value may be temperature and humidity data measured by the sensing unit, and the set value may be temperature and humidity data preset and stored in the controlling unit by a user. For example, the controlling unit may compare the measured temperature and humidity with preset temperature and humidity.

It may be determined whether a measurement value satisfies a set value range in S540 from the comparison result. When the measurement value satisfies a set value range, a current color temperature may be maintained, and the temperature and humidity may be again measured in S520. On the other hand, when a measurement value does not satisfy the set value range, a set value corresponding to the measurement value may be detected and a color temperature corresponding thereto may be determined in S550. In addition, the controlling unit may control the driving unit such that the illumination unit may be driven at a determined color temperature.

Then, the driving unit may drive the illumination unit so as to adjust a color temperature to the determined value in S560. For example, the driving unit may supply power required to drive the determined color temperature, to the illumination unit. Thus, the illumination unit may be adjusted to have a color temperature corresponding to a temperature and humidity preset by a user according to an ambient temperature and humidity.

Thus, the lighting system may automatically adjust a color temperature of indoor lighting according to a change in an ambient temperature and humidity, such that human emotions changed according to a change in the natural environment may be satisfied and human psychological stability may be obtained.

Figure 20:
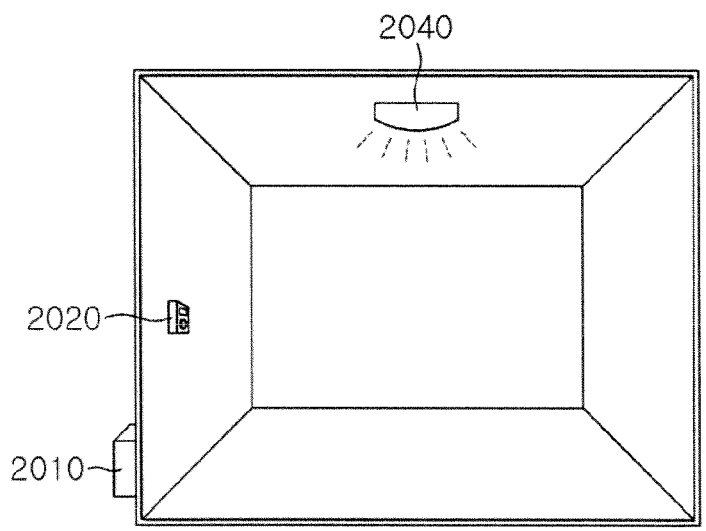
FIG. 20 is a schematic diagram illustrating an example provided by implementing the lighting system of FIG. 17.

FIG. 20 schematically illustrates an example of the lighting system of FIG. 17. As illustrated in FIG. 20, the illumination unit 2040 may be installed, as indoor lighting, on a ceiling surface. Here, in order to measure an outdoor temperature and humidity, the sensing unit 2010 may be implemented as a separate apparatus and installed on an outer wall. In addition, the controlling unit 2020 may be installed indoors so as to facilitate user setting and verification. However, the lighting system according to an exemplary embodiment of the present disclosure is not limited thereto, and may be applied to all types of lighting devices. For example, the lighting system may be installed on a wall so as to replace interior illumination or may be used as a lighting device usable indoors and outdoors such as a stand lamp or the like.

In such lighting devices using LEDs, an optical design may be changed according to the form of a product, a place of using a product, the purpose thereof. For example, in relation with emotional illumination as described above, in addition to a technology of controlling a color of illumination, temperature thereof, and brightness thereof, a technology for controlling illumination using a remote control by utilizing a portable device such as smartphones may be provided.

In addition, a visible light wireless communications technology to simultaneously realize a peculiar purpose of an LED light source and a purpose as a communications unit may be provided by adding a communication function to an LED lighting device and a display device. This is why the LED light source not only has favorable characteristics such as a relatively long lifespan, excellent power efficiency, and implementation of various colors, but has a high switching speed for digital communications and the availability of digital control, as compared to existing light sources.

The visible light wireless communications technology is a wireless communications technology in which information is wirelessly transferred using light within a visible light wavelength band, perceivable to the human eye. Such a visible light wireless communications technology may be discriminated from an existing wire optical communications technology and infrared wireless communications, in terms of using light within a visible light wavelength band, and may also be discriminated from a wire optical communications technology, in terms of being used in a wireless communications environment.

In addition, the visible light wireless communications technology has positive attributes such as convenience of using it freely without restriction thereon or permission in terms of use of frequency, and differentiation of being excellent for physical security and confirming a communication link with one's own eyes, in comparison with RF wireless communications, and in further detail, has convergence technology characteristics that a light source inherent purpose and communications function may be simultaneously obtained.

According to an exemplary embodiment of the present disclosure, deterioration of a film quality of an active layer may be prevented, thereby improving light characteristics such as electroluminescence, photoluminescence, and the like, preventing an efficiency droop phenomenon, and improving brightness.

While exemplary embodiments have been shown and described above, it will be apparent to those skilled in the art that modifications and variations could be made without departing from the scope of the present disclosure as defined by the appended claims.

What is claimed is:

1. A semiconductor light emitting device, comprising:
a first conductivity-type semiconductor layer including an n-type GaN contact layer, an n-type GaN layer disposed on the n-type GaN contact layer, doped with silicon (Si) acting as an n-type dopant in a concentration of $2\times10^{18}$ cm$^{-3}$ to $9\times10^{19}$ cm$^{-3}$, and having a thickness of 1 nm to 500 nm, and an n-type super-lattice layer disposed on the n-type GaN layer and having a structure in which two or more $Al_xIn_yGa_zN$ ($0\leq x,y,z\leq1$, $x+y+z>0$) having different compositions are repeatedly stacked;
a border layer disposed on the first conductivity-type semiconductor layer and having band gap energy decreasing in a direction away from the first conductivity-type semiconductor layer;
an active layer contacting the border layer and having a multiple quantum well structure in which five or more quantum well layers and four or more quantum barrier layers are alternately stacked; and
a second conductivity-type semiconductor layer including a p-type $Al_xIn_yGa_zN$ layer ($0\leq x,y,z\leq1$, $x+y+z>0$) disposed on the active layer and having a composition ratio of aluminum (Al) increased or decreased in a direction away from the active layer, and a p-type GaN layer disposed on the p-type $Al_xIn_yGa_zN$ layer ($0\leq x,y,z\leq1$, $x+y+z>0$), doped with magnesium (Mg) acting as a p-type dopant in a concentration of $1\times10^{18}$ cm$^{-3}$ to $9\times10^{21}$ cm$^{-3}$, and having a thickness of 30 nm to 150 nm, the concentration of magnesium being increased or decreased in a thickness direction,
wherein at least one of the first conductivity-type semiconductor layer, the border layer, the active layer and the second conductivity-type semiconductor layer has a V-shaped distortion containing layer formed thereon.

2. The semiconductor light emitting device of claim 1, wherein the border layer contains a dopant, the dopant is at least one of elements contained in the quantum well layer, and a concentration of the dopant is lower than that of the element contained in the quantum well layer.

3. The semiconductor light emitting device of claim 1, wherein the active layer emits light within a UV region (200 to 440 nm) or light within a blue region (440 nm to 480 nm).

4. The semiconductor light emitting device of claim 1, wherein the first conductivity-type semiconductor layer or the second conductivity-type semiconductor layer has one or both of a phosphor layer and a quantum dot layer disposed thereon, and the phosphor layer comprises,
at least one selected from a group consisting of at least one oxynitride-based phosphor selected from a group consisting of $Y_3Al_5O_{12}$:Ce, $Tb_3Al_5O_{12}$:Ce and $Lu_3Al_5O_{12}$:Ce; one silicate-based phosphor of $(Ba,Sr)_2SiO_4$:Eu or $(Ba,Sr)_3SiO_5$:Ce; at least one nitride-based phosphor selected from a group consisting of β-SiAlON:Eu, $La_3Si_6N_{11}$:Ce, α-SiAlON:Eu, $CaAlSiN_3$:Eu, $Sr_2Si_5N_8$:Eu, $SrSiAl_4N_7$:Eu, $SrLiAl_3N_4$:Eu, and $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$), Ln being at least one selected from a group consisting of a IIIa element and a rare-earth element, and M being at least one selected from a group consisting of Ca, Ba, Sr and Mg; and at least one fluoride-based phosphor selected from a group consisting of $K_2SiF_6$:$Mn^{4+}$, $K_2TiF_6$:$Mn^{4+}$, $NaYF_4$:$Mn^{4+}$ and $NaGdF_4$:$Mn^{4+}$.

5. The semiconductor light emitting device of claim 1, wherein a value of excitation power-independent shift ($\Delta E_1$) of the active layer is 5 meV or less.

6. The semiconductor light emitting device of claim 1, wherein the border layer is represented by an empirical formula $Al_xIn_yGa_{1-x-y}N$ ($0 \leq x \leq 0.1$, $0.01 \leq y \leq 0.1$).

7. The semiconductor light emitting device of claim 1, wherein the first conductivity-type semiconductor layer comprises a mesa-etched and exposed region, or the first conductivity-type semiconductor layer or the second conductivity-type semiconductor layer comprises a via, the semiconductor light emitting device comprises an electrode disposed on the exposed region or an electrode connected to the first or second conductivity-type semiconductor layer through the via,
a diameter of the via is in a range of 5 µm to 50 µm, and the number of the vias is 3 to 300.

8. The semiconductor light emitting device of claim 7, wherein the electrode is at least one of a distributed Bragg reflector configured of a metallic oxide, graphene, silver (Ag), aluminum (Al), $TiO_2$ and $SiO_2$, or a distributed Bragg reflector configured of $SiO_2$ and $Ta_2O_5$.

9. The semiconductor light emitting device of claim 1, wherein the border layer further comprises an n-type conductive impurity, the n-type conducive impurity is silicon, and a concentration of the silicon is in a range of $10^{17}/cm^3$ to $10^{18}/cm^3$.

10. A light emitting device package comprising the semiconductor light emitting device of claim 1.

11. A lighting device comprising the semiconductor light emitting device of claim 1, the lighting device being a bulb-type lighting device.

12. The lighting device of claim 11, wherein the lighting device emits light having a color temperature range of 2700 K to 5000 K.

13. The lighting device of claim 11, wherein the lighting device has a color rendering index Ra of 85 to 99.

14. A lighting device comprising the semiconductor light emitting device of claim 1, the lighting device being a bar-type lighting device.

* * * * *